(12) United States Patent
Hanaoka et al.

(10) Patent No.: US 6,940,160 B1
(45) Date of Patent: Sep. 6, 2005

(54) SEMICONDUCTOR DEVICE AND METHOD OF MANUFACTURE THEREOF, CIRCUIT BOARD, AND ELECTRONIC INSTRUMENT

(75) Inventors: Terunao Hanaoka, Suwa (JP); Haruki Ito, Chino (JP); Kazuhiko Nozawa, Nakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/700,464

(22) PCT Filed: Mar. 8, 2000

(86) PCT No.: PCT/JP00/01387

§ 371 (c)(1),
(2), (4) Date: Nov. 15, 2000

(87) PCT Pub. No.: WO00/55898

PCT Pub. Date: Sep. 21, 2000

(30) Foreign Application Priority Data

Mar. 16, 1999 (JP) .................................. 11/69420
Mar. 16, 1999 (JP) .................................. 11/69421
Mar. 18, 1999 (JP) .................................. 11/73043

(51) Int. Cl.[7] .......................................... H01L 23/48
(52) U.S. Cl. .................. 257/692; 257/698; 257/700
(58) Field of Search ............................ 257/692–690, 257/700–703, 698; 438/104, 108

(56) References Cited

U.S. PATENT DOCUMENTS 4,911,786 A * 3/1990 Kindl et al. .................. 216/13
4,942,142 A * 7/1990 Itozaki et al. ............... 505/233
4,972,251 A * 11/1990 Lehrer ......................... 257/633
5,013,689 A * 5/1991 Yamamoto et al. ......... 438/702
5,470,787 A * 11/1995 Greer ..................... 228/180.22
5,517,031 A * 5/1996 Wei et al. .............. 250/370.08
5,643,986 A * 7/1997 Ishikawa et al. ............ 524/366
5,744,382 A * 4/1998 Kitayama et al. .......... 438/106
6,001,488 A * 12/1999 Kataoka et al. ............. 428/447
6,075,290 A * 6/2000 Schaefer et al. ............ 257/737
6,284,563 B1 * 9/2001 Fjelstad ...................... 438/106
6,441,487 B2 * 8/2002 Elenius et al. .............. 257/738

FOREIGN PATENT DOCUMENTS

| JP | 62-19741 | 2/1987 |
| JP | 10-135270 | 5/1998 |
| JP | 11-204560 | 7/1999 |

(Continued)

*Primary Examiner*—Nathan J. Flynn
*Assistant Examiner*—Leonardo Andújar
(74) *Attorney, Agent, or Firm*—Oliff & Berridge, PLC

(57) ABSTRACT

A semiconductor device comprising: a semiconductor element (10) having a plurality of electrodes (12); an interconnect pattern (20) electrically connected to the electrodes (12); a plurality of laminated insulating layers (41, 42 and 43); and a plurality of external terminals (30) electrically connected to the interconnect pattern (20). A plurality of holes (44, 46, and 48) are respectively formed in the insulating layers (41, 42, and 43) to form an opening portion (40) communicating from the hole (48) in the highest insulating layer (43) to the hole (44) in the lowest insulating layer (41). An external terminal (30) is provided within the opening portion (40), and the second hole (46) formed in the higher positioned second insulating layer (42) is larger than the first hole (44) formed in the lower positioned first insulating layer (41).

18 Claims, 13 Drawing Sheets

FOREIGN PATENT DOCUMENTS

| | | |
|---|---|---|
| JP | 11-307563 | 11/1999 |
| JP | 2000-36509 | 2/2000 |
| WO | WO 95/08856 | 3/1995 |
| WO | 1998-033347 | 7/1998 |

* cited by examiner

SEMICONDUCTOR DEVICE AND METHOD OF MANUFACTURE THEREOF, CIRCUIT BOARD, AND ELECTRONIC INSTRUMENT

TECHNICAL FIELD

The present invention relates to a semiconductor device and method of manufacture thereof, a circuit board and an electronic instrument.

BACKGROUND ART

When high-density mounting is required of semiconductor devices, bare chip mounting is ideal. However, a bare chip presents problems of quality assurance and handling. In response to this, semiconductor devices have been developed to which CSP (Chip Scale/Size Package) is applied. There is no formal definition of CSP, but generally it is understood to refer to an IC package with a package size the same as an IC chip, or very slightly larger than an IC chip. To advance high-density mounting, the development of CSP technology is important. As a publication of a prior art relating to CSP may be cited International Publication No. WO95/08856.

According to this document, a gap is formed between a substrate having external terminals and a semiconductor chip, and this gap is filled with resin. This resin is resilient when cured. This resilient resin absorbs stress (thermal stress) applied to the external terminals. It should be noted that this stress is generated by the difference in the coefficients of thermal expansion of the semiconductor device and the circuit board on which the semiconductor device is mounted.

However, since it is difficult to form a thick layer of the resin disposed between the semiconductor chip and the substrate, thermal stress has not been adequately absorbed.

DISCLOSURE OF THE INVENTION

The present invention solves this problem, and has as its objective the provision of a semiconductor device capable of effectively absorbing thermal stress and a method of manufacture thereof, a circuit board and an electronic instrument.

(1) A semiconductor device of the present invention comprises:
 a semiconductor element having a plurality of electrodes;
 an interconnect pattern electrically connected to the electrode; and
 external terminals electrically connected to the interconnect pattern;
 wherein a plurality of insulating layers are formed around the external terminals on the interconnect pattern.

In the present invention, a semiconductor element includes not only individual semiconductor chips, but also each element of a set of elements before cutting into a plurality of semiconductor chips (for example a semiconductor wafer or the like).

According to this aspect of the present invention, stress applied to the external terminals can be more easily dispersed by the plurality of insulating layers.

It should be noted that in the present invention, the plurality of insulating layers may be not only two layers, but also a greater number of layers.

(2) In this semiconductor device, at least one of the plurality of insulating layers may have a stress relieving function.

This makes it possible to absorb stress applied to the external terminals by the insulating layer.

(3) In this semiconductor device, at least one of the plurality of insulating layers may be formed of a resin.

(4) In this semiconductor device, the insulating layers may contact the external terminals at opening portions each of which has an inclined surface providing a taper increasing in size from a lower layer to a higher layer of the insulating layers.

If the inner surface of the opening portion is an inclined surface, a contacting area between the external terminal and insulating layers is large, and stress can be absorbed.

(5) In this semiconductor device, each of the external terminals may include a base and a connection portion provided on the base; and the base may be provided in an opening portion through which each of the external terminals contacts the insulating layers.

Since the base contacts the plurality of insulating layers, stress can be relieved.

(6) In this semiconductor device, the insulating layers may contact the external terminals at opening portions each of which is formed with a curved surface.

In particular, if the base is formed on the inner surface of the opening portion, there is no corner on the opening extremity, and therefore base breakage can be prevented.

(7) In this semiconductor device, the interconnect pattern may be formed on a stress relieving layer formed below the plurality of insulating layers.

This makes it possible to absorb stress more effectively.

(8) In this semiconductor device, the uppermost layer of the insulating layers may be formed over the whole surface of the second layer of the insulating layers from the uppermost layer except for an area of the external terminals.

(9) In this semiconductor device, the uppermost layer of the insulating layers may have an area smaller than the area of a second layer of the insulating layers from the uppermost layer.

(10) In this semiconductor device, the insulating layers may include an upper layer and a lower layer of different characteristics.

In more detail, the stress applied to the external terminals is generated by the difference between the coefficients of thermal expansion of the circuit board on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower insulating layer closer to the semiconductor element can have its characteristics such as to correspond to the fact that the expansion and contraction of the semiconductor element is small. On the other hand, the upper insulating layer closer to the circuit board can have its characteristics such as to correspond to the fact that the expansion and contraction of the circuit board is large. By using upper and lower insulating layers having different characteristics, a deterioration of quality due to stress can be prevented.

(11) In this semiconductor device, the coefficient of thermal expansion of the upper layer of the insulating layers may be greater than the coefficient of thermal expansion of the lower layer of the insulating layers.

In more detail, the stress applied to the external terminals is generated by the difference between the coefficients of thermal expansion of the circuit board on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower insulating layer closer to the semiconductor element can have its coefficient of thermal expansion small to correspond to the fact that the expansion and contraction of the semiconductor element is small. On the other hand, the upper insulating layer closer to the circuit board can have its coefficient of thermal expansion large to correspond to the fact that the expansion and contraction of the circuit board is large. By using upper and lower insulating layers having different characteristics, a deterioration of quality due to stress can be prevented.

(12) In this semiconductor device, the Young's modulus of the lower layer of the insulating layers may be greater than the Young's modulus of the upper layer of the insulating layers.

The stress applied to the external terminals is, in more detail, generated by the difference between the coefficients of thermal expansion of the circuit board on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower insulating layer closer to the semiconductor element can have its Young's modulus larger, to correspond to the fact that the expansion and contraction of the semiconductor element is small. On the other hand, the upper insulating layer closer to the circuit board can have a smaller Young's modulus, to correspond to the fact that the expansion and contraction of the circuit board is larger. By using upper and lower insulating layers having different characteristics, a deterioration of quality due to stress can be prevented.

(13) A semiconductor device of the present invention comprises:
 a semiconductor element having a plurality of electrodes;
 an interconnect pattern electrically connected to the electrodes; and
 external terminals electrically connected to the interconnect pattern,
 wherein the interconnect pattern is formed on an insulating layer which is formed of at least one layer and has protrusions and depressions; and
 wherein the external terminals are formed in the depressions.

In the present invention, a semiconductor element includes not only individual semiconductor chips, but also each element of a set of elements before cutting into a plurality of semiconductor chips (for example a semiconductor wafer or the like).

According to this aspect of the present invention, the interconnect pattern is formed on the insulating layer, and moreover, is electrically connected to the external terminals in the depressions. That is to say, the electrical connection between the interconnect pattern and the external terminals is positioned on the insulating layer. Thus, the electrical connection between the interconnect pattern and the external terminals can be effectively ensured. Since the interconnect pattern is formed on the insulating layer, breakage can be prevented. Furthermore, the interconnect pattern is formed on the insulating layer, and is distanced from the semiconductor element. Therefore, signals within the integrated circuit of the semiconductor element and signals within the interconnect pattern are not prone to interfere, and crosstalk can be reduced.

(14) In this semiconductor device, the insulating layer may have a stress relieving function.

This makes it possible to absorb stress applied to the electrical connection between the interconnect pattern and the external terminals by the insulating layer.

(15) In this semiconductor device, the insulating layer may be formed of a resin.

(16) In this semiconductor device, each of the external terminals may include a base and a connection portion provided on the base, and the base and the interconnect pattern may be constructed as a single member.

By this means, since part of each external terminal and the interconnect pattern are formed integrally, the occurrence of electrical resistance between the two can be prevented.

(17) In this semiconductor device, each of the depressions may be formed to have an opening extremity larger than the bottom.

According to this, since the inner surface of each depression is an inclined surface, the area of contact between each external terminal and insulating layer is large, and stress can be absorbed.

(18) In this semiconductor device, the insulating layer may include an upper layer and a lower layer of different characteristics.

(19) In this semiconductor device, the insulating layer may be formed on the semiconductor element, and the coefficient of thermal expansion of the lower layer may be smaller than the coefficient of thermal expansion of the upper layer.

The stress applied to the external terminals is, in more detail, generated by the difference in the coefficients of thermal expansion of the circuit board (motherboard) on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower layer closer to the semiconductor element can have its coefficient of thermal expansion small as appropriate to the semiconductor element. On the other hand, the upper layer closer to the circuit board can have its coefficient of thermal expansion large, as appropriate to the circuit board. By using a plurality of layers having different characteristics, the stress can be effectively absorbed.

(20) In this semiconductor device, a protective film may be formed on the uppermost layer of the semiconductor device.

(21) According to the present invention, there is provided a circuit board on which the above described semiconductor device is mounted.

(22) According to the present invention, there is provided a circuit board on which the above described semiconductor device is mounted.

(23) An electronic instrument of the present invention has the above described semiconductor device.

(24) An electronic instrument of the present invention has the above described semiconductor device.

(25) A method of manufacture of a semiconductor device of the present invention comprises the steps of: forming an interconnect pattern electrically connected to a plurality of electrodes of a semiconductor element; forming external terminals on the interconnect pattern; and forming a plurality of insulating layers around the external terminals, over the interconnect pattern.

In the present invention, a semiconductor element includes not only individual semiconductor chips, but also each element of a set of elements before cutting into a plurality of semiconductor chips (for example a semiconductor wafer or the like). That is to say, the present invention may be applied to the embodiment of a set of elements such as a semiconductor wafer.

According to the semiconductor device manufactured by the method of the present invention, stress applied to the external terminals can be more easily dispersed.

It should be noted that in the present invention, the plurality of insulating layers may be not only two layers, but also a greater number of layers.

(26) In the step of forming the insulating layers of this method of manufacture, opening portions which are used for contacting the external terminals and constituted by first and second holes may be formed in the insulating layers which include first and second insulating layers; in this step, the first insulating layer is formed, the first holes are formed in the first insulating layer, the second insulating layer is formed over the first holes and the first insulating layer, and the second holes are formed in the second insulating layer over the first holes; and the external terminals may be formed after forming the insulating layers.

According to this, by repeating the steps of forming a single insulating layer and forming holes therein, a plurality of insulating layers having opening portions can be formed. By laminating the plurality of insulating layers, in total a thick insulating layer is formed. It is difficult to directly form opening portions in a single thick insulating layer, but by applying this method, a construction substantially equivalent to a single thick insulating layer can be obtained.

(27) In this method of manufacture of a semiconductor device, at least one of the plurality of insulating layers may be formed to have a stress relieving function.

This makes it possible to manufacture a semiconductor device in which stress applied to the external terminals is absorbed by the insulating layer.

(28) In this method of manufacture of a semiconductor device, at least one of the plurality of insulating layers may be formed of a resin.

(29) In this method of manufacture of a semiconductor device, the insulating layers may be formed to include an upper layer and a lower layer of different characteristics.

In the semiconductor device fabricated in this way, the stress applied to the external terminals is, in more detail, generated by the difference between the coefficients of thermal expansion of the circuit board on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower insulating layer closer to the semiconductor element can have its characteristics such as to correspond to the fact that the expansion and contraction of the semiconductor element is small. On the other hand, the upper insulating layer closer to the circuit board can have its characteristics such as to correspond to the fact that the expansion and contraction of the circuit board is large. By using upper and lower insulating layers having different characteristics, a deterioration of quality due to stress can be prevented.

(30) In this method of manufacture of a semiconductor device, the Young's modulus of the lower layer of the insulating layers may be made larger than the Young's modulus of the upper layer of the insulating layers.

In the semiconductor device fabricated in this way, the stress applied to the external terminals is, in more detail, generated by the difference between the coefficients of thermal expansion of the circuit board on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower insulating layer closer to the semiconductor element can have its Young's modulus larger, to correspond to the fact that the expansion and contraction of the semiconductor element is small. On the other hand, the upper insulating layer closer to the circuit board can have a smaller Young's modulus, to correspond to the fact that the expansion and contraction of the circuit board is larger. By using upper and lower insulating layers having different characteristics, a deterioration of quality due to stress can be prevented.

(31) In this method of manufacture of a semiconductor device, the coefficient of thermal expansion of the upper layer of the insulating layers may be made larger than the coefficient of thermal expansion of the lower layer of the insulating layers.

In the semiconductor device fabricated in this way, the stress applied to the external terminals is, in more detail, generated by the difference between the coefficients of thermal expansion of the circuit board on which the semiconductor device is mounted and the semiconductor element. Generally, since the coefficient of thermal expansion of the circuit board is greater, its expansion and contraction is greater, and since the coefficient of thermal expansion of the semiconductor element is smaller, its expansion and contraction is smaller. Therefore, the lower insulating layer closer to the semiconductor element can have its coefficient of thermal expansion small, to correspond to the fact that the expansion and contraction of the semiconductor element is small. On the other hand, the upper insulating layer closer to the circuit board can have its coefficient of thermal expansion large, to correspond to the fact that the expansion and contraction of the circuit board is larger. By using upper and lower insulating layers having different characteristics, a deterioration of quality due to stress can be prevented.

(32) A method of manufacture of a semiconductor device of the present invention comprises the steps of:
    forming an insulating layer on a semiconductor element, the insulating layer comprising at least one layer and having protrusions and depressions;
    forming an interconnect pattern on the insulating layer, the interconnect pattern being connected to a plurality of electrodes of the semiconductor element; and
    forming external terminals in the depressions, the external terminals being electrically connected to the interconnect pattern.

In the present invention, a semiconductor element includes not only individual semiconductor chips, but also each element of a set of elements before cutting into a plurality of semiconductor chips (for example a semiconductor wafer or the like). That is to say, the present invention may be applied to the embodiment of a set of elements such as a semiconductor wafer.

According to this aspect of the present invention, the interconnect pattern is formed on the insulating layer, and moreover, is electrically connected to the external terminals in the depressions. That is to say, the electrical connection between the interconnect pattern and the external terminals is positioned on the insulating layer. Thus, the electrical connection between the interconnect pattern and the external terminals can be effectively ensured. Since the interconnect pattern is formed on the insulating layer, breakage can be prevented. Furthermore, the interconnect pattern is formed on the insulating layer, and is distanced from the semiconductor element. Therefore, signals within the integrated circuit of the semiconductor element and signals within the interconnect pattern are not prone to interfere, and crosstalk can be reduced.

(33) In this method of manufacture of a semiconductor device, a base which is a bottom portion of each of the external terminals may be formed on an inner surface of each of the depressions, as a single member with the interconnect pattern; and each of the external terminals may be formed by providing a connection portion on the base.

Since the interconnect pattern and base are integrally formed, both can be formed in a single operation. In this case, the occurrence of electrical resistance between a part of each external terminal and the interconnect pattern can be prevented.

(34) In this method of manufacture of a semiconductor device, the insulating layer may be formed to have a stress relieving function.

This makes it possible to absorb stress applied to the electrical connection between the interconnect pattern and the external terminals by the insulating layer.

(35) In this method of manufacture of a semiconductor device, the insulating layer may be formed of a resin.

(36) In this method of manufacture of a semiconductor device, a protective film may be formed on the uppermost layer of the semiconductor device.

BEST MODE FOR CARRYING OUT THE INVENTION

The present invention is now described in terms of a number of preferred embodiments, with reference to the drawings.

First Embodiment

Figure 1:
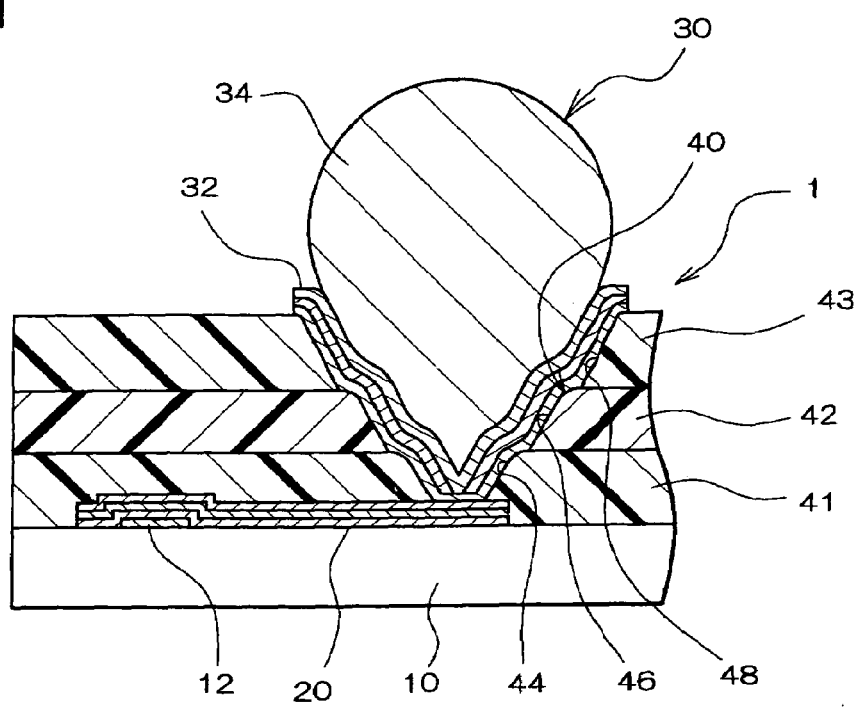
FIG. 1 is a sectional view of a first embodiment of the semiconductor device of the present invention.

FIG. 1 shows a first embodiment of the semiconductor device. This semiconductor device 1 comprises a semiconductor chip 10, an interconnect pattern 20, an external terminal 30, and a plurality of insulating layers 41, 42, and 43. The semiconductor device 1 has a package size approximately equal to the size of the semiconductor chip 10, and can therefore be classed as CSP, or can also be termed a flip chip equipped with a stress relieving function.

On one surface (the active surface) of the semiconductor chip 10 is formed a plurality of electrodes 12. When the plan form of the semiconductor chip 10 is a rectangle (a square or an oblong) the plurality of electrodes 12 is formed along at least one side (including a pair of opposing sides and all sides). Alternatively, the plurality of electrodes 12 may be formed in the center of one surface of the semiconductor chip 10. On the semiconductor chip 10 avoiding the electrodes 12 is formed a passivation film of SiN, $SiO_2$, MgO, or the like. The passivation film is an electrical insulating film.

The interconnect pattern 20 is formed on the surface of the semiconductor chip 10 on which the electrodes 12 are formed, and is electrically connected to the electrodes 12. The interconnect pattern 20 is commonly formed from multiple layers. For example, the interconnect pattern 20 can be formed by laminating any of copper (Cu), chromium (Cr), titanium (Ti), nickel (Ni), titanium-tungsten (Ti—W), gold (Au), aluminum (Al), nickel-vanadium (NiV), and tungsten (W). When the electrodes 12 are formed on the periphery of the semiconductor chip 10, the interconnect pattern 20 is brought in toward the center of the semiconductor chip 10.

The external terminals 30 are formed on the interconnect pattern 20, avoiding the electrodes 12. Since the electrodes 12 are avoided, stress applied to the external terminals 30 is not directly applied to the electrodes 12. The external terminal 30 is formed of a base 32 and a connection portion 34. The connection portion 34 is for example a solder ball, and is used for electrical bonding with a circuit board. The base 32 is formed to be depressed in the central portions, so as to easily accept the connection portion 34. The base 32 may also be formed of multiple layers, and can be formed of the materials which can be selected for the interconnect pattern 20.

The plurality of insulating layers 41, 42, and 43 are formed by lamination, and between the layers may be interposed other layers. The insulating layers 41, 42, and 43 are each provided around a part of the respective external terminals 30. In more detail, a part of the external terminal 30 (for example a part of the base 32) is bonded to the interconnect pattern 20, and the lowest insulating layer 41 is provided around the lower extremity of the base 32. The highest insulating layer 43 is provided around the upper extremity of the base 32. Then at least one insulating layer 42 is formed in the intermediate portion of the base 32, between the lowest insulating layer 41 and the highest insulating layer 43.

At least one of the insulating layers 41, 42, and 43 may have a stress relieving function. The insulating layers 41, 42, and 43 can be formed of polyimide resin, silicone denatured polyimide resin, epoxy resin, silicone denatured epoxy resin, benzocyclobutene (BCB), polybenzoxazole (PBO), or the like. It should be noted that the lowest insulating layer 41 is formed over the electrodes 12, interconnect pattern 20 and a passivation film not shown in the drawings. The highest insulating layer 43 is, formed over the entire surface of the second insulating layer 42 from the top, except for the region of the external terminals 30.

In the lowest insulating layer 41 is formed a plurality of holes 44. The holes 44 are formed over the interconnect pattern 20, at the positions for connection with the external terminals 30. The inner surface of the holes 44 is an inclined surface, providing a taper such that the opening extremity is larger than the bottom. The opening extremity of the holes 44 is formed as a curved surface.

In an intermediate layer 42, for example the second insulating layer from the bottom are formed holes 46. These holes 46 are formed over the holes 44 in the lowest insulating layer 41. The inner surface of the holes 46 is an inclined surface, providing a taper such that the opening extremity is larger than the bottom.

In the highest insulating layer 43, a plurality of holes 48 are formed. These holes 48 are formed over the holes 44 in the lowest insulating layer 41 and the holes 46 in the intermediate insulating layer 42.

In this embodiment, compared with the first hole formed in the first insulating layer, the second hole formed in the second insulating layer and positioned above is larger. Here the first and second insulating layers indicate any two of the above described plurality of insulating layers 41, 42, and 43.

For example, the lowest insulating layer 41 can be defined as the first insulating layer, and the insulating layer 42 thereon defined as the second insulating layer. In this case, compared with the first holes 44 formed in the first insulating layer 41, the second holes 46 formed in the second insulating layer 42 are larger. The intermediate insulating layer 42 can be defined as the first insulating layer, and the insulating layer 43 thereon defined as the second insulating layer. In this case, compared with first holes 46 formed in the first insulating layer 42, the second holes 48 formed in the second insulating layer 43 are larger.

The holes 44, 46, and 48 formed in the plurality of insulating layers 41, 42, and 43 are communicating, and form an opening portion 40. The opening portion 40 opens over the interconnect pattern 20. Since the holes 44, 46, and 48 increase in size from the bottom up, the opening portion 40 forms a shape which widens from the bottom toward the opening extremity. In more detail, since the communicating holes 44, 46, and 48 formed in the plurality of insulating layers 41, 42, and 43 are of different sizes, the opening portion 40 has a stepped form.

A part of the external terminal 30 (for example the base 32) is provided to contact the inner surface of the opening portion 40. Since the opening portion 40 has a stepped form, stress applied to the external terminals 30 is dispersed and absorbed. Corresponding to the inclination of the inner surfaces of the holes 44, 46, and 48, the side surface of the base 32 is also inclined. In more detail, the base 32 has the form of an inverted frustum (inverted frustum of a cone, inverted frustum of a pyramid). By virtue of this, the area of contact between the base 32 and the holes 44, 46, and 48 is increased, and therefore the adhesion properties between the two are improved. Further, the opening extremity of the holes 44, 46, and 48 is formed as a curved surface, and since there are no corners, the base 32 is not subject to breakage.

Since the lateral surface of the external terminals 30 (for example the lateral surface of the base 32) is inclined, as seen from a direction along a perpendicular to the surface of the semiconductor chip 10, a part of the insulating layers 41, 42, and 43 is positioned between a part of the respective external terminal 30 and the semiconductor chip 10. In more detail, a part of the external terminal 30 (for example a part of the base 32) is bonded to the interconnect pattern 20, and between the part excluding this part and the semiconductor chip 10 is provided a part of the insulating layers 41, 42, and 43.

Figure 2:
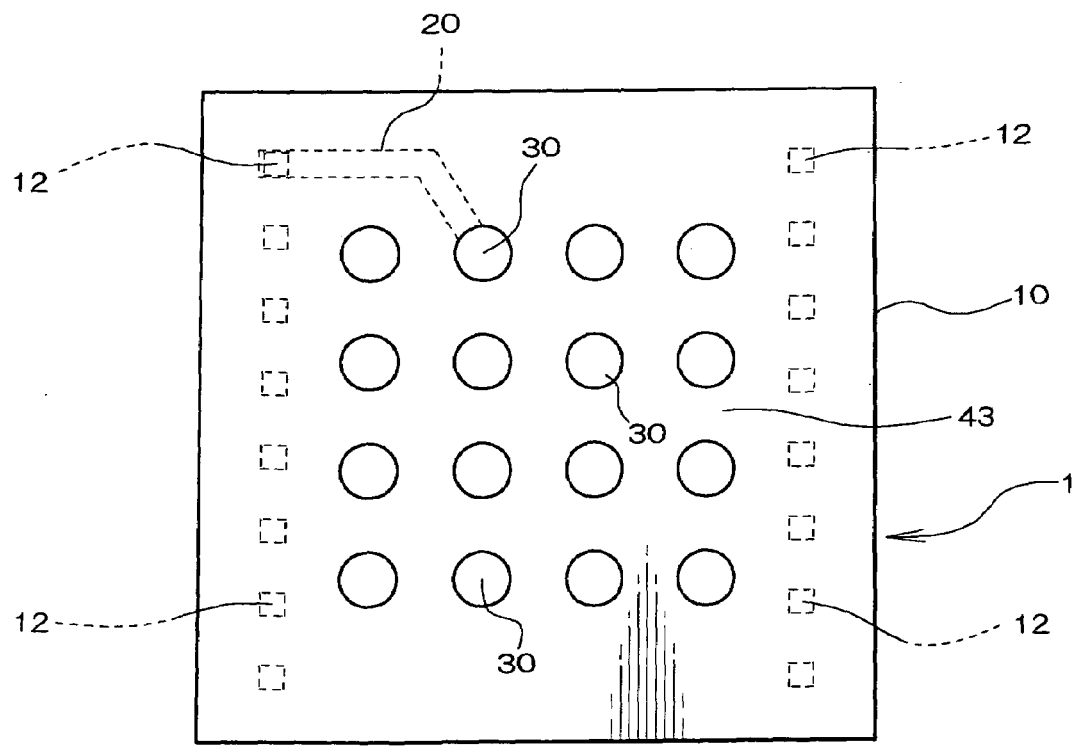
FIG. 2 is a plan view of the first embodiment of the semiconductor device of the present invention.

FIG. 2 is a plan view of this embodiment of the semiconductor device. In this figure, the interconnect pattern 20 is formed from the electrodes 12 of the semiconductor chip 10 toward the center of the active surface, and the interconnect pattern 20 is provided with the external terminals 30.

It should be noted that as shown in this figure, the external terminals 30 are not over the electrodes 12 of the semiconductor chip 10, but are provided in the active region of the semiconductor chip 10 (the region in which the active elements are formed). By providing the insulating layers 41, 42, and 43 (see FIG. 1) in the active region, and further disposing (drawing in) the interconnect pattern 20 within the active region, the external terminals 30 can be provided within the active region. That is to say, a pitch conversion can be carried out. Since the active region having a certain area can be used as a region for the external terminals 30, a degree of flexibility in disposing the external terminals 30 is improved.

Then by bending the interconnects constituting the interconnect pattern 20 at the required positions, the external terminals 30 can be provided in a lattice. It should be noted that this is not an essential construction of the present invention, and therefore the external terminals 30 do not necessarily have to be disposed in a lattice.

In comparing the width of the electrodes 12 and the width of the interconnect pattern 20, preferably the following holds:

width of electrodes 12≦width of interconnect pattern 20.

In particular, in the case that the following holds:

width of electrodes 12<width of interconnect pattern 20, not only is the resistance of the interconnect pattern 20 reduced, but also line breakage can be prevented, since the strength is increased.

Next the method of manufacture of this embodiment of the semiconductor device is described. FIGS. 3 to 8 show the stages in forming the plurality of insulating layers. It should be noted that the present invention can be applied to an individual semiconductor element such as the semiconductor chip 10, but in the description of this embodiment a semiconductor wafer 11 is used, being a plurality of semiconductor elements taken as a set. Then an example will be described of the present invention applied to the respective semiconductor elements which will be separated into the individual semiconductor chips 10. This applies equally to the embodiments below.

First, a semiconductor wafer 11 (see FIG. 9) is taken, which has a plurality of electrodes 12, and on which a passivation film (not shown in the drawings) is formed to avoid the electrodes 12. The interconnect pattern 20 is then formed to be connected to the electrodes 12. The interconnect pattern 20 may be formed on the semiconductor wafer 11 or, more specifically, on a passivation film.

Next, the plurality of insulating layers 41, 42, and 43 are formed, and communicating holes 44, 46, and 48 are formed to form the opening portion 40. This process includes the following first to fourth steps.

First Step

Figure 3:
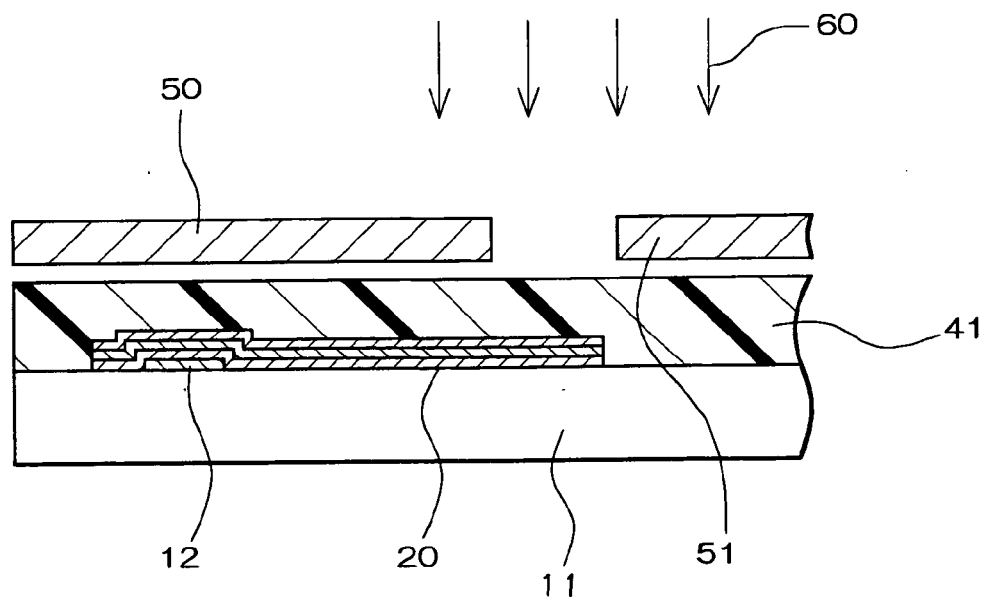
FIG. 3 shows a method of manufacture of the first embodiment of the semiconductor device of the present invention.

As shown in FIG. 3, the insulating layer 41 is formed. When the insulating layer 41 is positioned as the lowest layer, it is formed on the surface of the semiconductor wafer 11 on which the electrodes 12, passivation film (not shown in the drawings), and interconnect pattern 20 are formed. As the material of the insulating layer 41 can be used a resin whose properties change in response to energy (light, ultraviolet rays, radiation or the like), such as a photopolymer. The material of the insulating layer 41 may be such as, when energy is radiated thereon, to increase solubility (positive type), or to decrease solubility (negative type).

Second Step

Figure 4:
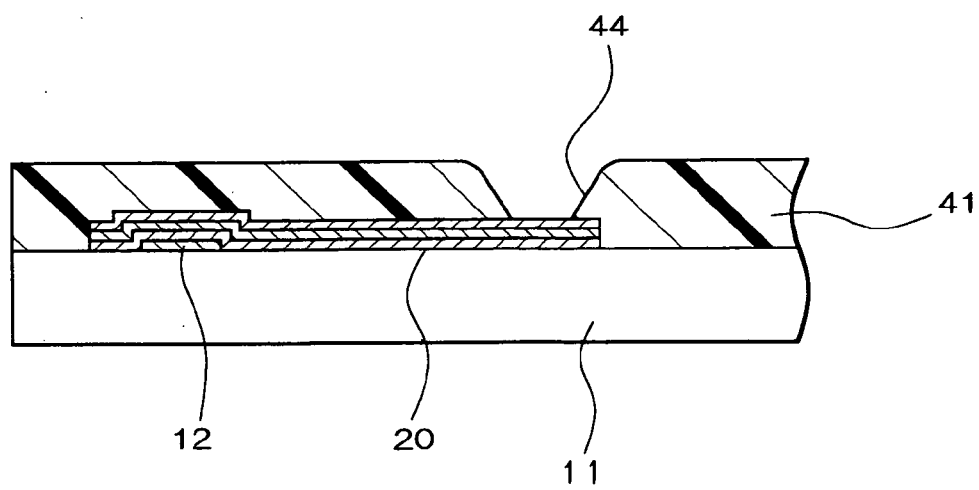
FIG. 4 shows the method of manufacture of the first embodiment of the semiconductor device of the present invention.

As shown in FIG. 4, a hole 44 is formed in the insulating layer 41. For example, as shown in FIG. 3, a mask 50 in which an opening 51 is formed is disposed over the insulating layer 41, energy 60 is irradiated, and by subsequent development the hole 44 is formed. When the insulating layer 41 is such that when energy is irradiated the solubility increases, the opening 51 is disposed above the region for forming the hole 44. When the insulating layer 41 is such that when energy is irradiated the solubility decreases, the region corresponding to the hole 44 is covered, and the opening 51 is disposed above the remaining region. When applying the above described energy irradiation technology (optical exposure technology or the like), since energy passes around the opening 51 in the mask 50, the opening extremities of the hole 44 are formed as a curved surface.

Third Step

Figure 5:
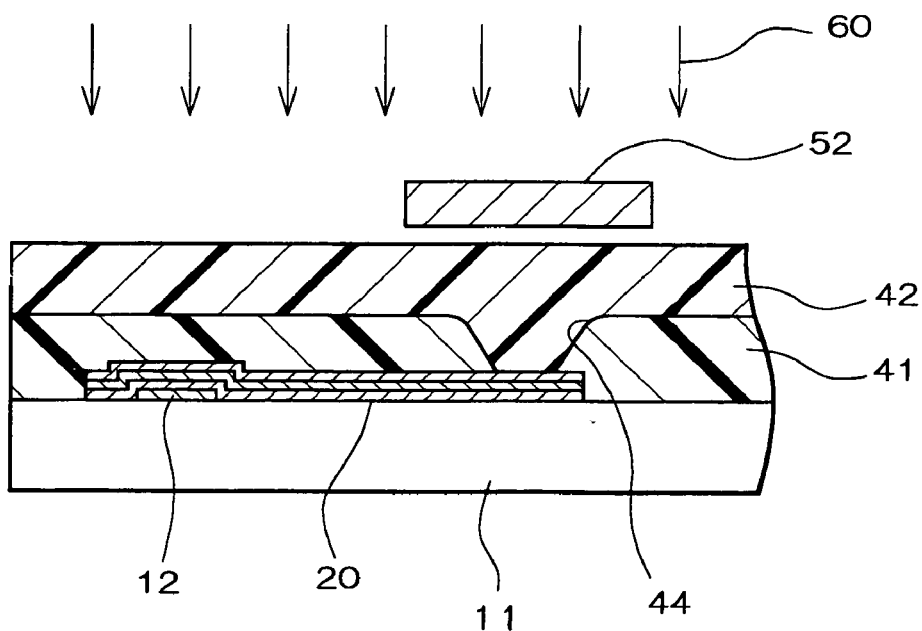
FIG. 5 shows the method of manufacture of the first embodiment of the semiconductor device of the present invention.

As shown in FIG. 5, over the insulating layer 41, the insulating layer 42 is formed. It should be noted that the lower insulating layer 41 can be defined as the first insulating layer, and the insulating layer 42 thereon can be defined as the second insulating layer. The hole 44 formed in the insulating layer 41 is also filled with the material of the insulating layer 42. This step is preferably carried out after the insulating layer 41 has been cured.

The material of the insulating layer 42 positioned above is preferably such that when energy is irradiated the solubility decreases.

Fourth Step

Figure 6:
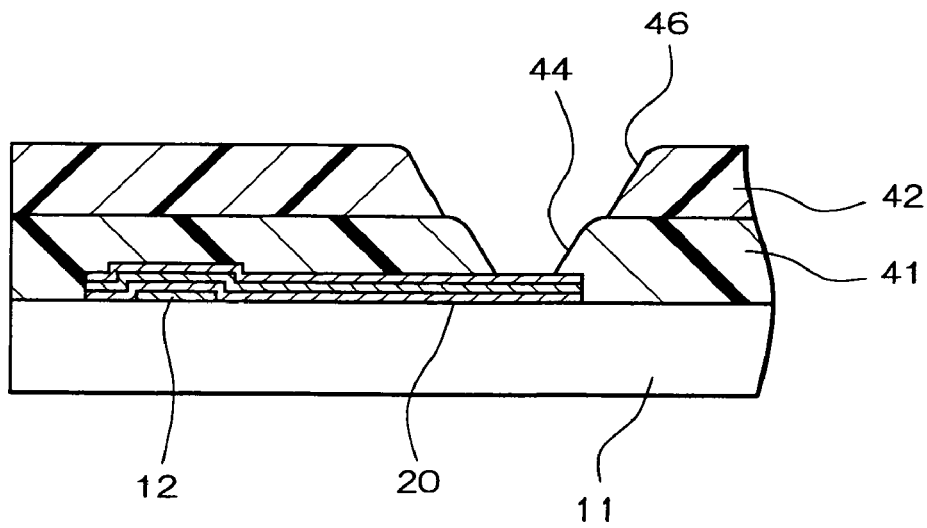
FIG. 6 shows the method of manufacture of the first embodiment of the semiconductor device of the present invention.

As shown in FIG. 6, the hole 46 is formed in the insulating layer 42. The hole 46 is formed so as to communicate with the hole 44 formed in the lower insulating layer 41. The lower hole 44 can be can be defined as the first hole, and the hole 46 thereon can be defined as the second hole. The second hole 46 is formed to be larger than the first hole 44. To form the second hole 46, a method of irradiating energy can be applied. When the material of the second insulating layer 42 is such that when energy is irradiated the solubility decreases, for example, the step shown in FIG. 5 is carried out. That is to say, a mask 52 covering only over the first hole 44 is disposed over the second insulating layer 42, and energy 60 is irradiated. By doing this, in the region in which the irradiation of the energy 60 is obstructed by the mask 52 the solubility is not decreased, and therefore removal by subsequent development is possible. The part of the material of the second insulating layer 42 which has filled the first hole 44 formed in the first insulating layer 41 can also be removed. In this way, the second hole 46 is formed in the second insulating layer 42. The opening extremity of the second hole 46 is formed with a curved surface because of the bending of energy around the mask 52.

It should be noted that over the first hole 44 the material of the second insulating layer 42 is not of uniform thickness, but over the first insulating layer 41 the material of the second insulating layer 42 is of uniform thickness. Therefore, in the region other than over the first hole 44, energy 60 is irradiated uniformly over the material of the second insulating layer 42, and in this region the material of the second insulating layer 42 can be uniformly cured. On the other hand, over the first hole 44 the material of the second insulating layer 42 is uniformly protected from the irradiation of the energy 60 by the mask 52. Then, of the material of the second insulating layer 42, the portion disposed over the first hole 44 can all be removed.

Subsequent Steps

Figure 7:
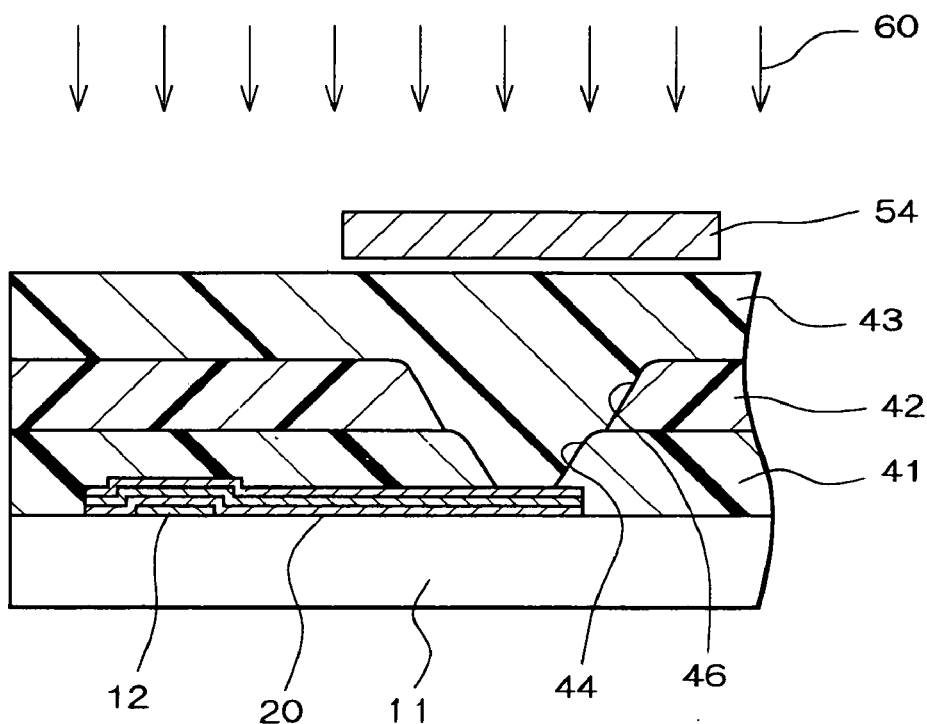
FIG. 7 shows the method of manufacture of the first embodiment of the semiconductor device of the present invention.

When forming further insulating layers over the above described first and second insulating layers 41 and 42, the above described process is repeated. For example, as shown in FIG. 7, over the insulating layer 42, the insulating layer 43 is formed.

For these two insulating layers 42 and 43, the lower insulating layer 42 can be defined as the first insulating layer, and the insulating layer 43 thereon can be defined as the second insulating layer. The hole 46 formed in the lower insulating layer 42 is also filled with the material of the insulating layer 43. This process is preferably carried out after the insulating layer 42 has been cured.

The material of the insulating layer 43 disposed at the top is preferably such that when energy is irradiated the solubility decreases.

Figure 8:
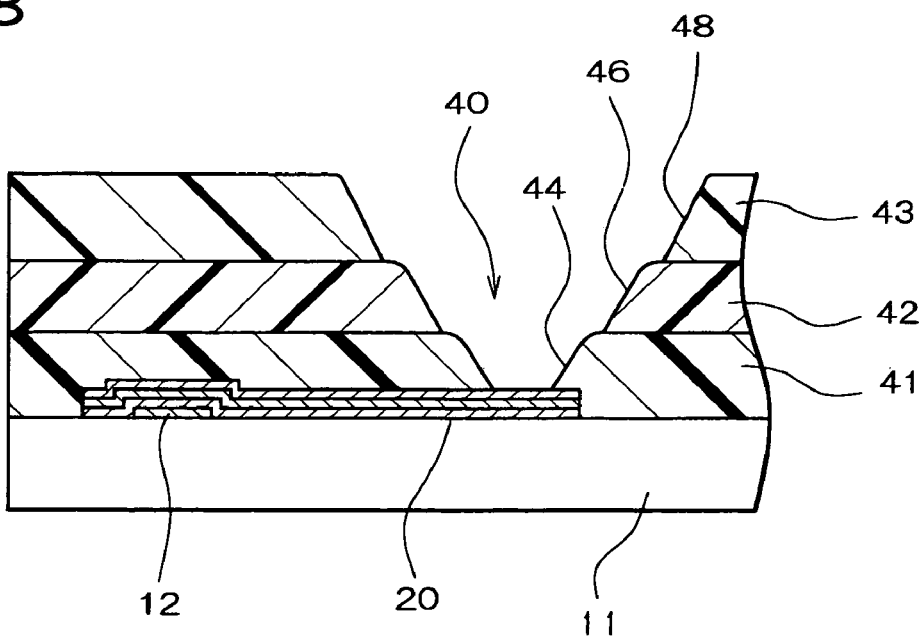
FIG. 8 shows the method of manufacture of the first embodiment of the semiconductor device of the present invention.

As shown in FIG. 8, a hole 48 is formed in the insulating layer 43. The hole 48 is formed to communicate with the hole 46 formed in the lower insulating layer 42. The lower hole 46 can be defined as the first hole, and the hole 48 thereabove can be defined as the second hole. The second hole 48 is formed to be larger than the first hole 46. To form the second hole 48, a method of irradiating energy can be applied. When the material of the second insulating layer 43 is such that when energy is irradiated the solubility decreases, for example, the step shown in FIG. 7 is carried out. That is to say, a mask 54 covering only the first hole 46 is disposed over the second insulating layer 43, and energy 60 is irradiated. By doing this, in the region in which the irradiation of the energy 60 is obstructed by the mask 54 the solubility is not decreased, and therefore removal by subsequent development is possible. The part of the material of the second insulating layer 43 which has filled the first hole 46 formed in the first insulating layer 42 can also be removed. In this way, the second hole 48 is formed in the second insulating layer 43. The opening extremity of the second hole 48 is formed with a curved surface because of the bending of energy around the mask 54.

It should be noted that over the first hole 46 the material of the second insulating layer 43 is not of uniform thickness, but over the first insulating layer 42 the material of the second insulating layer 43 is of uniform thickness. Therefore, in the region other than over the first hole 46 energy 60 is irradiated uniformly over the material of the second insulating layer 43, and in this region the material of the second insulating layer 43 can be uniformly cured. On the other hand, over the first hole 46 the material of the second insulating layer 43 is uniformly protected from the irradiation of the energy 60 by the mask 54. Then, of the material of the second insulating layer 43 the portion disposed over the first hole 46 can all be removed.

By the above process, the communicating holes 44, 46, and 48 are formed in the plurality of insulating layers 41, 42, and 43, and the opening portion 40 can be formed. That is to say, substantially the same construction as the opening portion 40 formed in an insulating layer formed of a thick single layer can be obtained. For example, if the thickness of each of the insulating layers 41, 42, and 43 is of the order of 20 $\mu$m, then a layer with a total thickness of the order of 60 $\mu$m can be formed and the opening portion 40 formed. The detail of the construction of the holes 44, 46, and 48 and opening portion 40 and their effect are as described above.

According to this embodiment, for each of the single layers of the plurality of insulating layers 41, 42, and 43, corresponding holes 44, 46, and 48 are formed. Moreover, since the hole formed in an upper layer is larger than the hole formed in a lower layer, even if an energy irradiation technology such as an optical exposure technology is applied, a high precision opening portion 40 can be formed. Alternatively, after forming the plurality of insulating layers 41, 42, and 43, a laser may be used to form the opening portion 40.

Figure 9:
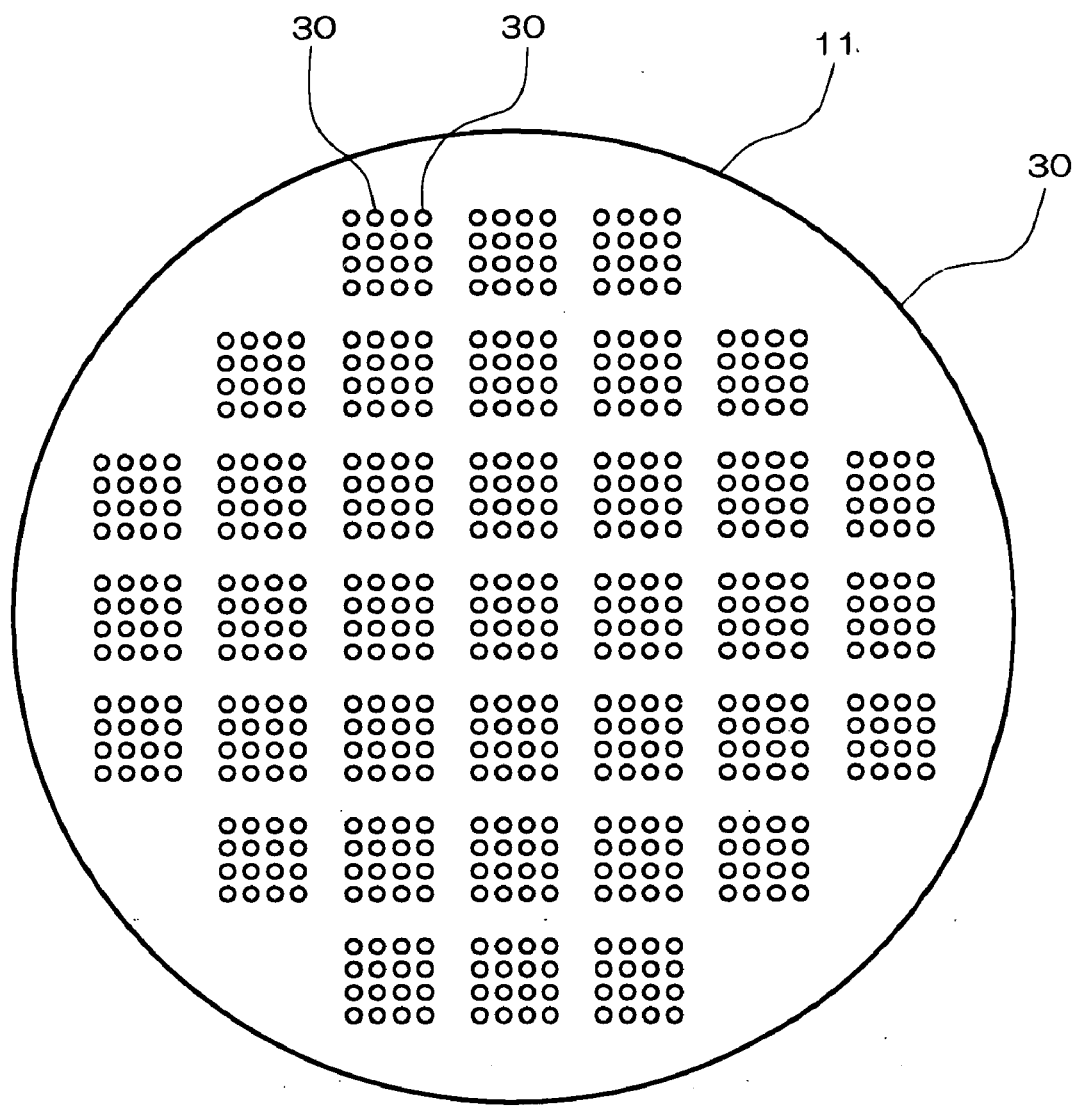
FIG. 9 shows the method of manufacture of the first embodiment of the semiconductor device of the present invention.

The opening portions 40 open over the interconnect pattern 20. As shown in FIG. 9, the external terminals 30 are provided on the interconnect pattern 20 through the opening portions 40. A part of the external terminal 30 (for example the base 32) is provided to contact the inner surface of the opening portion 40. For example, the base 32 is formed integrally by sputtering, not only on the interconnect pattern 20, but also on the inner surface of the opening portion 40. When the base 32 is provided, a connection portion 34 such as a solder ball or the like is provided thereon. Alternatively, by providing solder cream on the base 32, this may be fused, and formed into a ball by surface tension. If required, on the insulating layer 43 a further protective layer may be formed.

The semiconductor wafer 11 shown in FIG. 9 can also be termed a semiconductor device, but by dicing the semiconductor wafer 11, the semiconductor device 1 shown in FIG. 1 can be obtained.

Second Embodiment

Figure 10:
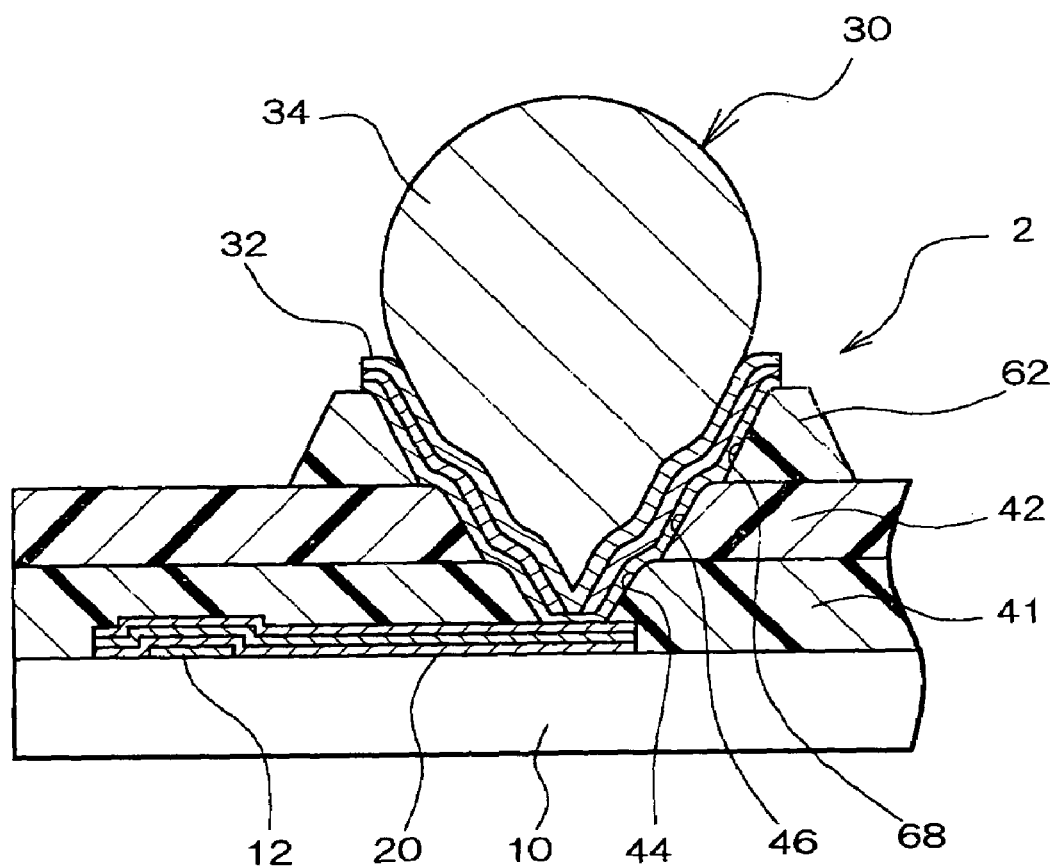
FIG. 10 shows a second embodiment of the semiconductor device of the present invention.

FIG. 10 shows a second embodiment of the semiconductor device of the present invention. A semiconductor device 2 differs from that of the first embodiment in that a highest insulating layer 62 is formed only around the external terminal 30, on the surface of the underlying insulating layer 42. In other respects this is the same as the first embodiment. It should be noted that in the insulating layer 62 is formed a hole 68 of the same construction as the hole 48 in the first embodiment. According to this embodiment, the highest insulating layer 62 is small in plan view, and is therefore easily deformed, and more able to cope with stress stemming from thermal stress.

Third Embodiment

Figure 11:
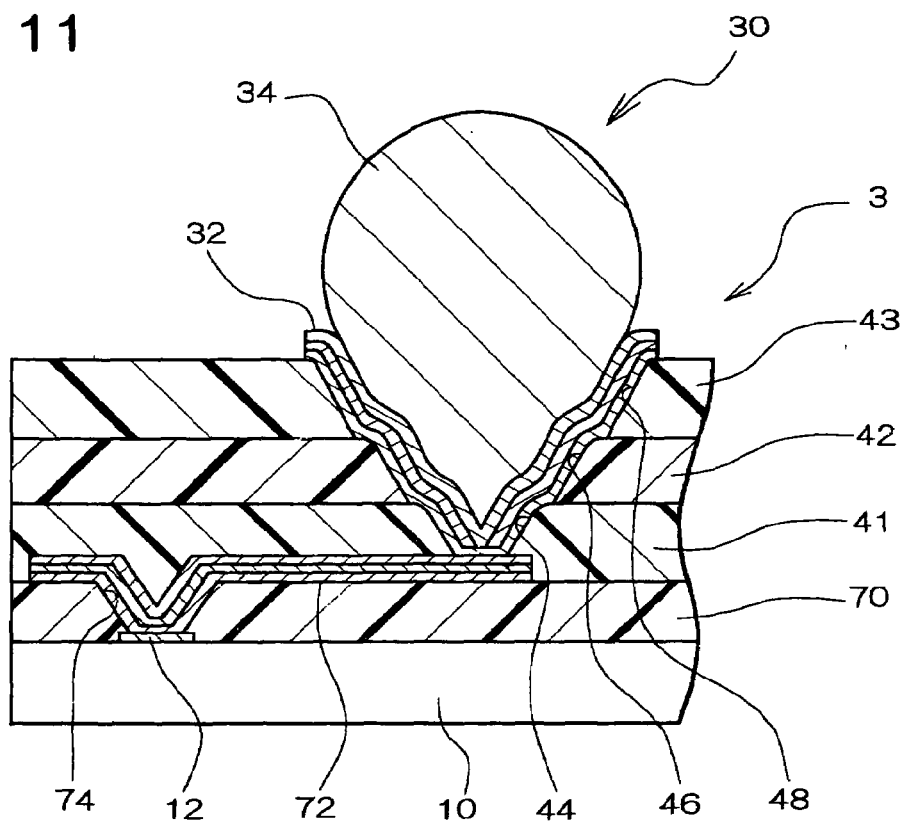
FIG. 11 shows a third embodiment of the semiconductor device of the present invention.

FIG. 11 shows a third embodiment of the semiconductor device of the present invention. A semiconductor device 3 differs from that of the first embodiment in having a stress relieving layer 70 formed on a semiconductor chip 10, and an interconnect pattern 72 formed thereon.

The stress relieving layer 70 can be formed of those of the materials which can be selected for the insulating layers 41, 42, and 43 which provide a stress relieving function. The stress relieving layer 70 is formed on the surface of the semiconductor chip 10 on which the electrodes 12 are formed, so as to avoid the electrodes 12. In the stress relieving layer 70, over the electrode 12, a hole 74 is formed. On the inner surface of the hole 74 also, the interconnect pattern 72 is formed. The inner surface of the hole 74 is an inclined surface with a taper which makes the opening extremity larger than the bottom. As a result, the interconnect pattern 72 rises not perpendicularly but gently from the electrodes 12 to the top surface of the stress relieving layer 70. In this way, since the bending angle of the interconnect pattern 72 is gentle, breakage thereof is prevented.

On the interconnect pattern 72, in addition to the provision of the external terminals 30, insulating layers 41, 42, and 43 are formed. For the details thereof, the description of the first embodiment is applied.

According to this embodiment, in addition to the effect described in the first embodiment, stress can also be relieved by the stress relieving layer 70.

Fourth Embodiment

Figure 12:
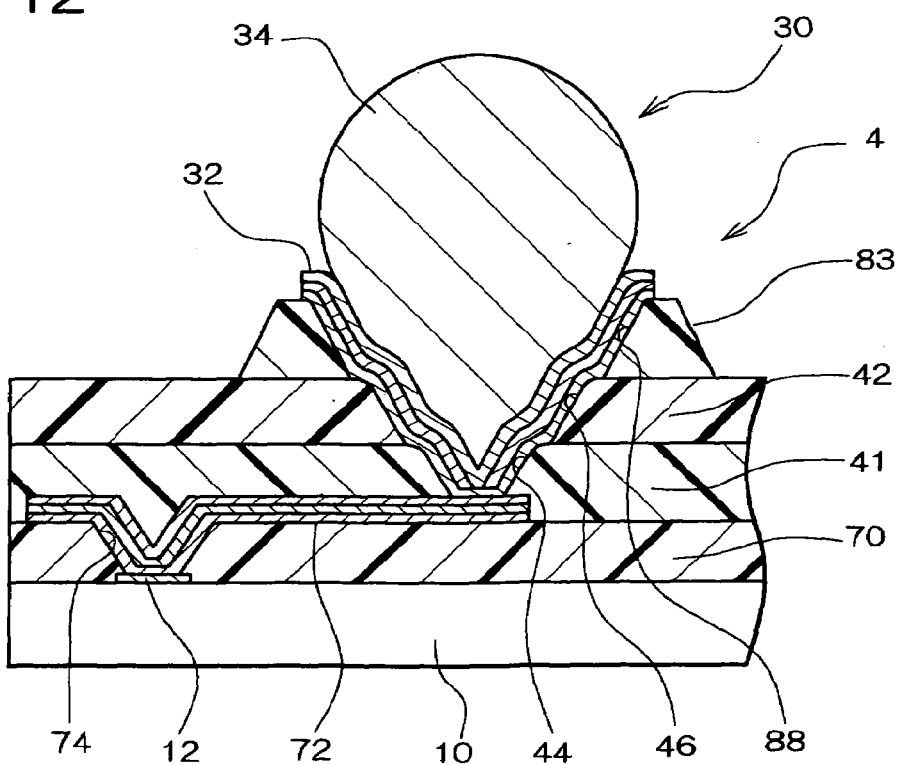
FIG. 12 shows a fourth embodiment of the semiconductor device of the present invention.

FIG. 12 shows a fourth embodiment of the semiconductor device of the present invention. A semiconductor device 4 differs from that of the third embodiment in that a highest insulating layer 83 is formed only around the external terminal 30, on the surface of the underlying insulating layer 42. In other respects this is the same as the third embodiment. It should be noted that in the insulating layer 83 is formed a hole 88 of the same construction as the hole 48 in the third embodiment. According to this embodiment, since the insulating layer 83 is small in plan view, it is therefore easily deformed, and is more able to cope with stress stemming from thermal stress.

Fifth Embodiment

Figure 13:
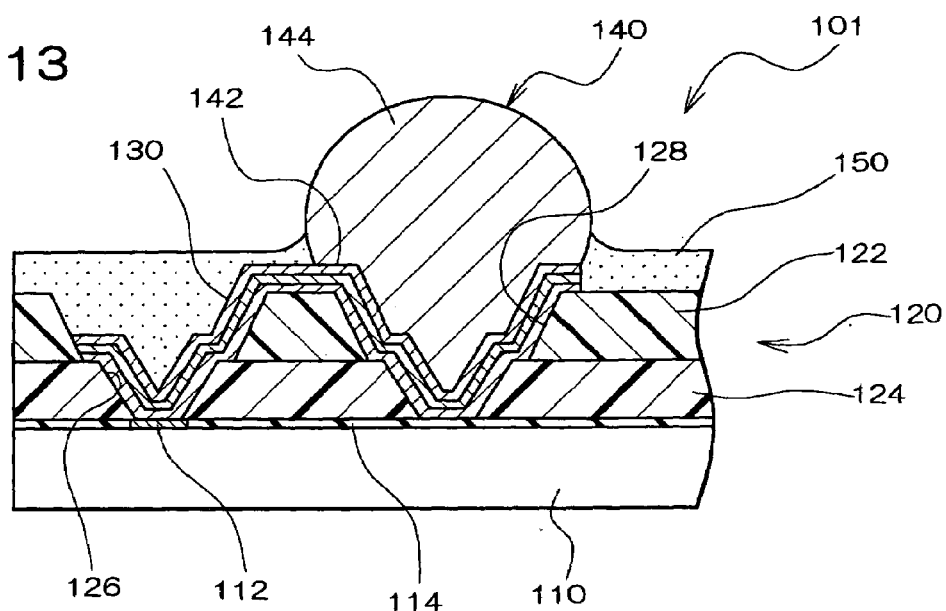
FIG. 13 is a sectional view showing a fifth embodiment of the semiconductor device of the present invention.

FIG. 13 shows a fifth embodiment of the semiconductor device. This semiconductor device 101 comprises a semiconductor chip 110, an insulating layer 120, an interconnect pattern 130, and external terminals 140. The semiconductor device 101 has a package size approximately equal to the size of the semiconductor chip 110 and can therefore be classed as CSP, or can also be termed a flip chip equipped with a stress relieving function.

For the semiconductor chip 110 the description of the semiconductor chip 10 of the first embodiment is applied. Note that the passivation film 114 is not an essential element of the invention corresponding to this embodiment, but is preferably formed.

The insulating layer 120 can be formed of a material described in the first embodiment. The insulating layer 120 may have a stress relieving function. The insulating layer 120 may be formed of a plurality of layers, and each of these layers may have different characteristics. For example, an upper layer 122 close to the external terminals 140 may have a coefficient of thermal expansion which is larger than the coefficient of thermal expansion of a lower layer 124 closer to the semiconductor chip 110. By this means, the coefficient of thermal expansion of the lower layer 124 closer to the semiconductor chip 110 approaches that of the semiconductor chip, and the coefficient of thermal expansion of the upper layer 122 closer to the circuit board (motherboard) approaches that of the circuit board, as a result of which the stress can be effectively absorbed. It should be noted that the stress applied to the external terminals 140 is, in more detail, generated by the difference between the coefficients of thermal expansion of the circuit board (motherboard) on which the semiconductor device 101 is mounted and the semiconductor chip 110. Generally, the coefficient of thermal expansion of the circuit board is greater, and thus its expansion and contraction is greater, while the coefficient of thermal expansion of the semiconductor chip 110 is smaller, and its expansion and contraction is smaller.

The insulating layer 120 is formed on the surface on which electrodes 112 are formed, and is formed to avoid the electrodes 112. In some cases the insulating layer 120 may overhang a part of each electrode 112. However, the electrode 112 is required to be partially exposed, to the extent that the electrical function of the electrode 112 can be fulfilled. That is to say, as long as there is an exposed part of the electrode 112 over which the insulating layer 120 is not provided, other parts of the electrode 112 may be coated with the insulating layer 120. Opening portions 126 are formed in the insulating layer 120 at the positions over the electrodes 112. Each of the opening portions 126 is of a form such that the opening extremity is larger than the bottom, and has an inclined inner surface.

On the insulating layer 120, in a region avoiding the electrodes 112, a plurality of depressions 128 are formed. The depressions 128 are of a form such that the opening extremity is larger than the bottom, and have an inclined inner surface. The depressions 128 may be formed to communicate with the upper layer 122 and lower layer 124. The depressions 128 may penetrate to the surface of the semiconductor chip 110, and for example the passivation film 114 may be exposed.

The interconnect pattern 130 is formed from the electrodes 112 to the insulating layer 120. In more detail, the interconnect pattern 130 is electrically connected to the electrodes 112 in the opening portion 126 formed in the insulating layer 120. To the interconnect pattern 130, the description of the interconnect pattern 20 of the first embodiment applies. If the inner surface of the opening portion 126 is inclined, then since the angle between the inner surface of the opening portion 126 and the surface of the insulating layer 120 is increased, breakage of the interconnect pattern 130 is prevented.

The external terminals 140 are provided in the depressions 128. Since the depressions 128 are formed to avoid being directly over the electrodes 112, stress applied to the external terminals 140 is less easily transmitted to the electrodes 112. Each external terminal 140 comprises a base 142 and a connection portion 144. The connection portion 144, may be for example a solder ball, and is used for electrical bonding to the circuit board. The base 142 is in the form of an inverted frustum (inverted frustum of a cone, inverted frustum of a pyramid) corresponding to the form of the inner surface of the depressions 128. The base 142 is depressed in the center, in order more easily to accept the connection portion 144. The base 142 also may be formed of multiple layers, and can be formed of the materials which can be selected for the interconnect pattern 130.

Since the interconnect pattern 130 is formed as far as the opening extremity of the depressions 128, at this opening extremity the interconnect pattern 130 and external terminals 140 are electrically connected. That is to say, since the connection between the external terminals 140 and the interconnect pattern 130 is positioned on the insulating layer 120, stress applied to this connection portion can also be absorbed by the insulating layer. If the inner surface of the depressions 128 is an inclined surface, the base 142 and interconnect pattern 130 are connected at a large angle, breakage of this portion is prevented. It should be noted that the base 142 forming a part of the external terminal 140 and the interconnect pattern 130 may be formed integrally.

Since the depressions 128 are formed with the opening extremity larger than the bottom, the lateral surface of the external terminals 140 (for example the lateral surface of the base 142) is also inclined. As a result, as seen from a direction along a perpendicular to the surface of the semiconductor chip 110, a part of the insulating layer 120 is positioned between parts of respective external terminals 140 and the semiconductor chip 110.

The interconnect pattern 130 is covered by a protective layer 150. The protective layer 150 may be for example a solder resist. The protective layer 150 is formed on the stress relieving layer 120, avoiding the external terminals 140. The protective layer 150 may cover a part of each external terminal 140, but it is necessary to avoid at least the top extremity of each external terminal 140.

According to this embodiment of the semiconductor device 101, the interconnect pattern 130 is formed on the insulating layer 120, and moreover is electrically connected to the external terminals 140 at the opening extremity of the depressions 128. That is to say, the electrical connection portion between the interconnect pattern 130 and the external terminals 140 is positioned on the insulating layer 120. As a result, stress applied to the electrical connection portion between the interconnect pattern 130 and the external terminals 140 is also absorbed by the insulating layer 120. In this way, the electrical connection between the interconnect pattern 130 and the external terminals 140 can be effectively ensured. Since the interconnect pattern 130 is formed on the insulating layer 120, breakage is prevented. Furthermore, the interconnect pattern 130 is formed on the insulating layer 120, and is distanced from the semiconductor chip. Therefore, signals within the integrated circuit of the semiconductor chip 110 and signals within the interconnect pattern 130 are not prone to interfere, and crosstalk is reduced.

Figure 14:
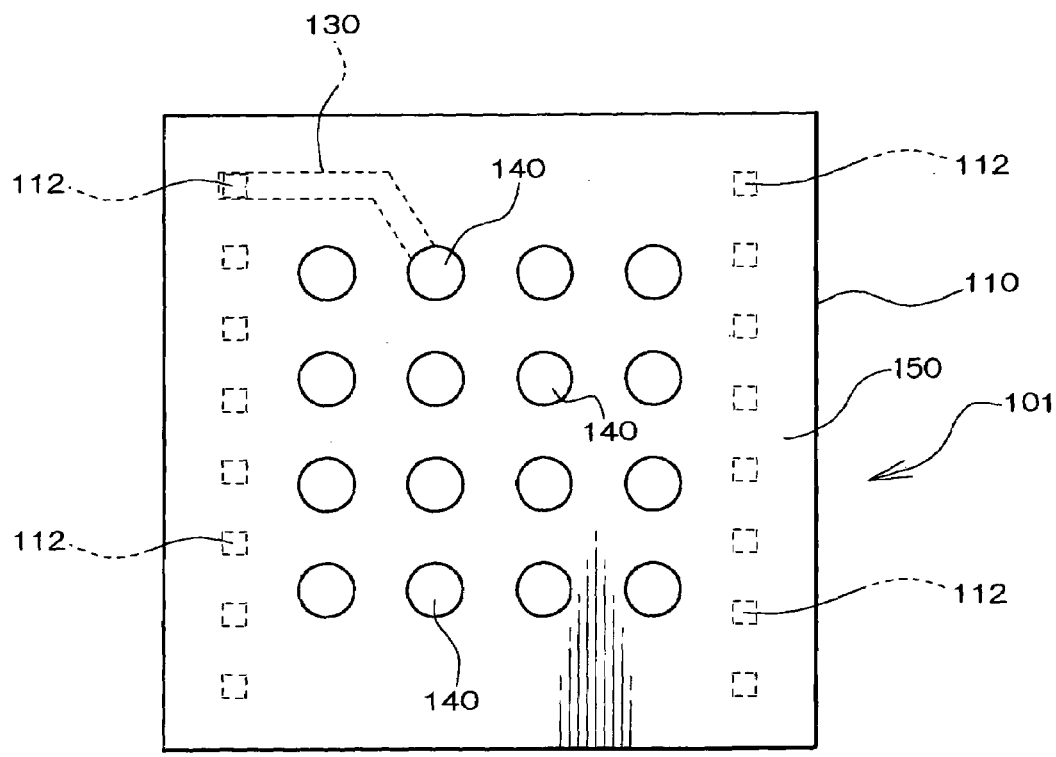
FIG. 14 is a plan view showing the fifth embodiment of the semiconductor device of the present invention.

In FIG. 14 is shown a plan view of this embodiment of the semiconductor device. In this figure, the interconnect pattern 130 is formed from the electrodes 112 of the semiconductor chip 110 in the direction of the center of the active surface, and the external terminals 140 are electrically connected to the interconnect pattern 130.

It should be noted that with regard to the provision of the external terminals 140 in the active region of the semiconductor chip 110, the provision of the insulating layer 120 (see FIG. 13) in the active region, and the disposition of the interconnect pattern 130 within the active region, the description in the first embodiment in relation to FIG. 2 applies. With regard to the form of the interconnect pattern 130, the description in the first embodiment in relation to FIG. 2 applies.

Next the method of manufacture of this embodiment of the semiconductor device is described.

First, as described in the first embodiment, a semiconductor wafer is taken, before separation into semiconductor chips 110. The semiconductor wafer has a plurality of electrodes 112, and a passivation film 114 is formed, avoiding the electrodes 112.

First Step

The insulating layer 120 is formed on the semiconductor wafer. The insulating layer 120 may be formed by laminating a plurality of layers. A plurality of depressions 128 are formed in the insulating layer 120. The opening portions 126 are formed in the insulating layer 120 at the positions over the electrodes 112 of the semiconductor wafer. The order of these steps is not significant. For example, the insulating layer 120 may be formed, and then the depressions 128 and opening portions 126 may be formed simultaneously. In this case, the insulating layer 120 is formed of a resin sensitive to energy such as light or radiation, and energy is irradiated to enable the portions of formation of the depressions 128 and opening portions 126 in the insulating layer 120 to be removed, thus carrying out development. It should be noted that the form of the depressions 128 and opening portions 126 is as described above.

Second Step

The interconnect pattern 130 is formed from the electrodes 112 over the insulating layer 120 to the opening extremities of the depressions 128. The external terminals 140 which are electrically connected to the interconnect pattern 130 at the opening extremities of the depressions 128 are provided in the depressions 128. The order of these steps is not significant.

For example, the interconnect pattern 130 formed from the electrodes 112 over the inner surface of the opening portions 126 to the opening extremities of the depressions 128 in the insulating layer 120, and the bases 142 formed on the inner surface of the depressions 128 and connected to the interconnect pattern 130 at the opening extremities of the depressions 128, can be formed integrally. In this step, sputtering or the like can be can be applied. Thereafter, the connection portions 144 such as solder balls are provided on the bases 142. Alternatively, a solder cream may be provided on each base 142, this may be fused, and formed into a ball by surface tension. In this way the external terminals 140 can be provided. If required, a protective layer 150 is formed on the insulating layer 120. Then the semiconductor wafer is diced, and the above described semiconductor device 101 can be obtained.

Sixth Embodiment

Figure 15:
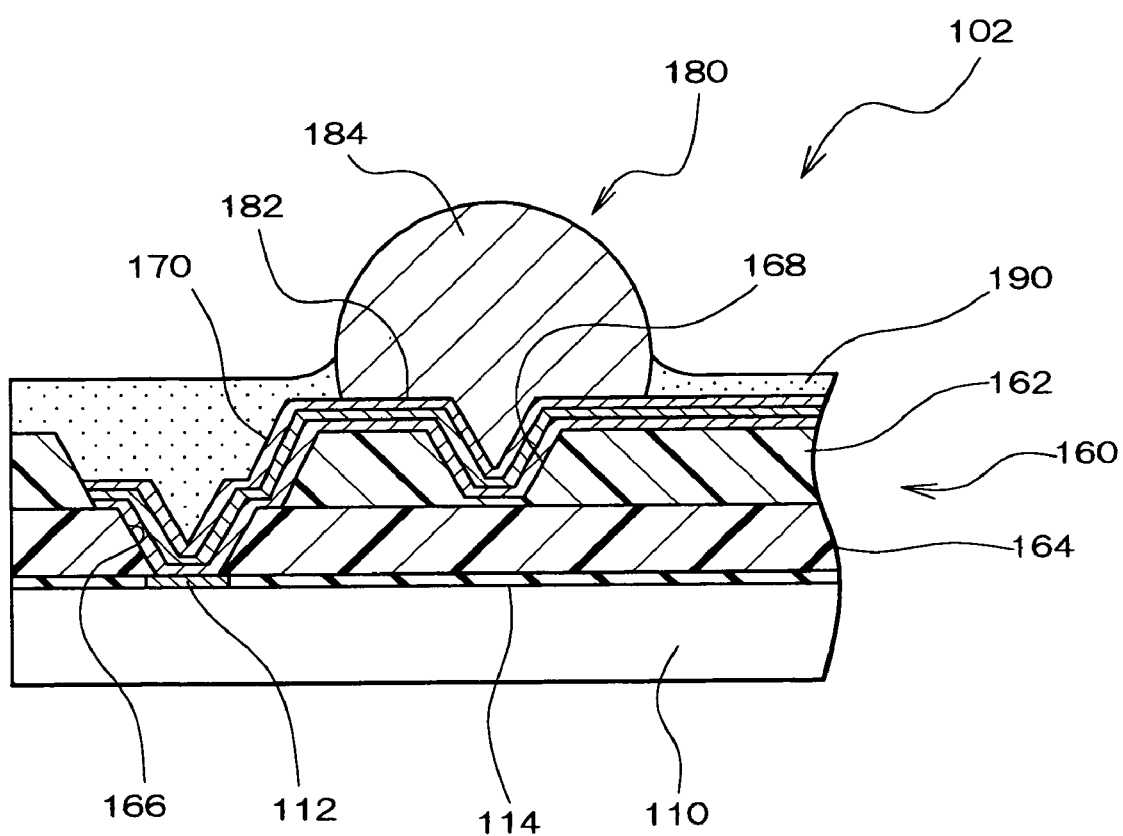
FIG. 15 shows a sixth embodiment of the semiconductor device of the present invention.

FIG. 15 shows a sixth embodiment of the semiconductor device of the present invention. A semiconductor device 102 comprises the semiconductor chip 110 described in the fifth embodiment, an insulating layer 160, an interconnect pattern 170, and external terminals 180. The insulating layer 160 is formed from a plurality of layers. Opening portions 166 are formed in the insulating layer 160 at the positions over the electrodes 112, and the interconnect pattern 170 is electrically connected to the electrodes 112.

In the insulating layer 160, depressions 168 are formed. The depressions 168 are formed only in an upper layer 162 of the plurality of layers constituting the insulating layer 160, and are not formed in a lower layer 164. This point differs from the fifth embodiment, but for the remainder of the construction, the construction of the fifth embodiment can be applied. A base 182 is formed in each depression 168, and a connection portion 184 is provided on the base 182. A protective layer 190 is formed on the interconnect pattern 170.

In this embodiment of the semiconductor device 102 too, the electrical connection portion of the interconnect pattern 170 and external terminals 180 is positioned over the insulating layer 160. As a result, stress applied to the electrical connection portion between the interconnect pattern 170 and the external terminals 180 is absorbed by the insulating layer 160. Other effects are as described in the fifth embodiment.

Seventh Embodiment

Figure 16:
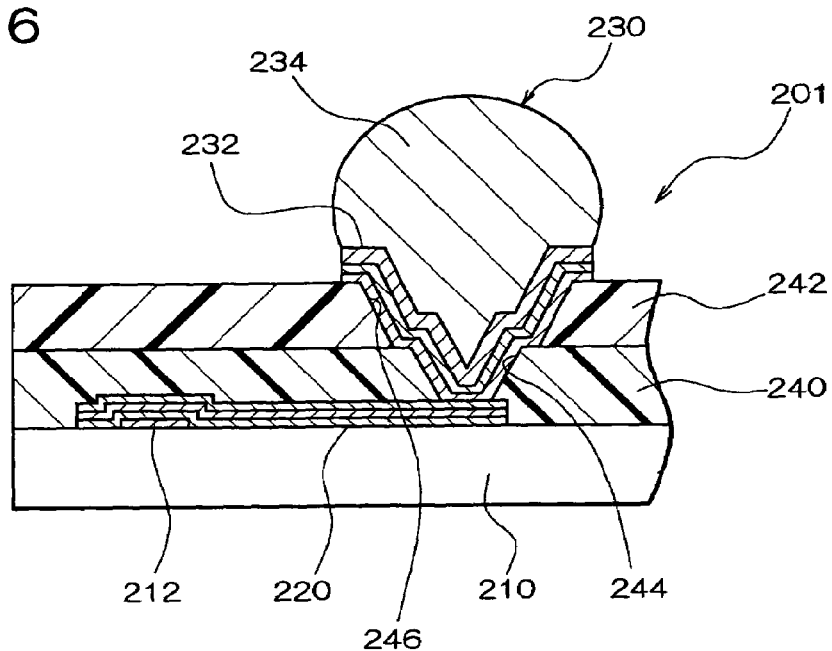
FIG. 16 is a sectional view showing a seventh embodiment of the semiconductor device of the present invention.

FIG. 16 shows a seventh embodiment of the semiconductor device. This semiconductor device 201 comprises a semiconductor chip 210, an interconnect pattern 220, external terminals 230, and first and second insulating layers 240 and 242. The semiconductor device 201 has a package size approximately equal to the size of the semiconductor chip 210, and can therefore be classed as CSP, or can also be termed a flip chip equipped with a stress relieving function.

For the semiconductor chip 210 the description of the semiconductor chip 10 in the first embodiment is applied.

For the interconnect pattern 220, the description of the interconnect pattern 20 in the first embodiment is applied. The external terminal 230 comprises a base 232 and a connection portion 234, and in details these have the same construction as the external terminals 30 of the first embodiment.

The first and second insulating layers 240 and 242 are formed around the external terminals 230. At least one of the first and second insulating layers 240 and 242 may have a stress relieving function. The first and second insulating layers 240 and 242 can be formed of the materials described in the first embodiment. It should be noted that the first insulating layer 240 is positioned on the side of the semiconductor chip 210, and is formed over the electrode 212, interconnect pattern 220 and passivation film not shown in the drawings. The second insulating layer 242 is, except for the region of the external terminals 230, formed over the entire surface of the first insulating layer 240.

In the first insulating layer 240 a first opening portions 220 are formed. The first opening portions 244 are formed over the interconnect pattern 244 at the positions for connection with the external terminals 230. The inner surface of each first opening portion 244 is an inclined surface, providing a taper such that the opening increases in size progressively from the bottom.

In the second insulating layer 242, second opening portions 246 are formed. The second opening portions 246 are formed over the first opening portions 244. The inner surface of each second opening portion 246 is an inclined surface, providing a taper such that the opening increases in size progressively from the bottom.

A part of the external terminal 230 (for example the base 232) is provided to contact the inner surface of the first and second opening portions 244 and 246. Corresponding to the inclination of the inner surfaces of the first and second opening portions 244 and 246, the lateral surface of the base 232 is also inclined. In more detail, the base 232 has the form of an inverted frustum (inverted frustum of a cone, inverted frustum of a pyramid).

Since the lateral surface of the external terminal 230 (for example the lateral surface of the base 232) is inclined, as seen from a direction along a perpendicular to the surface of the semiconductor chip 210, a part of the first and second insulating layers 240 and 242 is positioned between a part of respective external terminals 230 and the semiconductor chip 210. In more detail, a part of the external terminal 230 (for example a part of the base 232) is bonded to the interconnect pattern 220. Between the external terminal 230 other than this part and the semiconductor chip 210, a part of the first and second insulating layers 240 and 242 is provided.

In this embodiment, the first insulating layer 240 and the second insulating layer 242 have different characteristics. For example, the Young's modulus of the first insulating layer 240 is greater than the Young's modulus of the second insulating layer 242. The coefficient of thermal expansion of the second insulating layer 242 is greater than the coefficient of thermal expansion of the first insulating layer 240.

Stress applied to the external terminal 230 is, in more detail, generated by the difference between the coefficients of thermal expansion of the circuit board on which the semiconductor device 201 is mounted and the semiconductor chip 210. Generally, since the coefficient of thermal expansion of the circuit board is greater, its expansion and contraction is greater, and since the coefficient of thermal expansion of the semiconductor chip 210 is smaller, its expansion and contraction is smaller. Corresponding to the fact that the expansion and contraction of the semiconductor chip 210 is smaller, the first insulating layer 240 positioned closer to the semiconductor chip 210 has a larger Young's modulus. On the other hand, corresponding to the fact that the expansion and contraction of the circuit board is larger, the second insulating layer 242 formed closer to the circuit board has a has a smaller Young's modulus. Thus, by using the first and second insulating layers 240 and 242 having different characteristics, the stress can be effectively absorbed.

Figure 17:
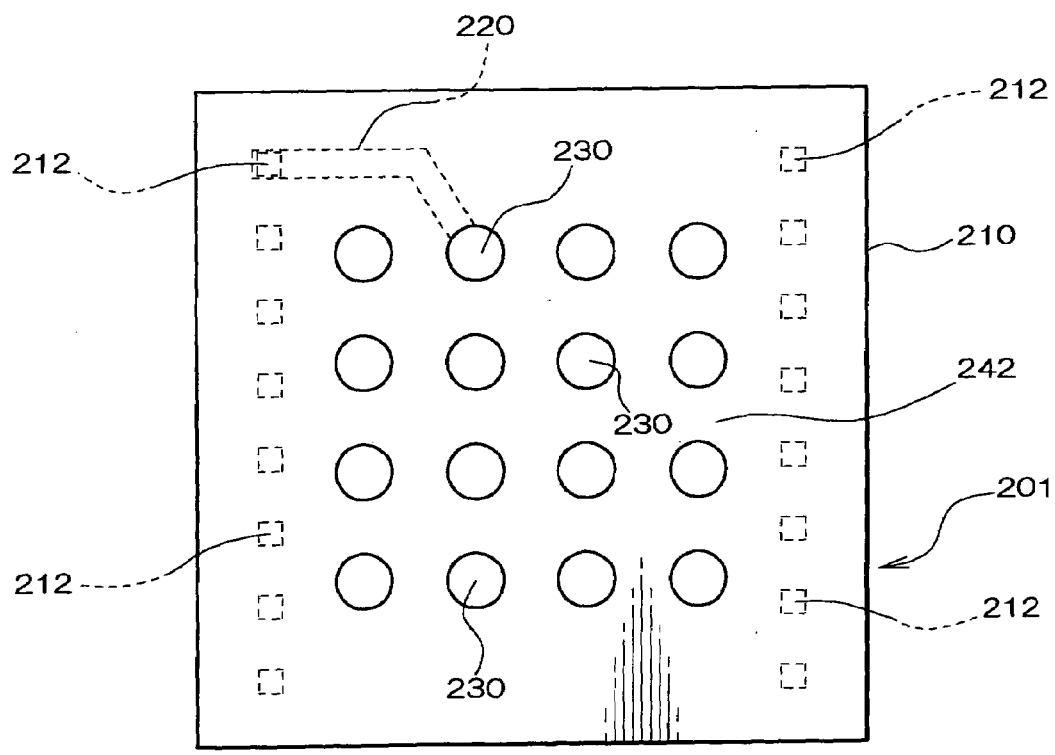
FIG. 17 is a plan view showing the seventh embodiment of the semiconductor device of the present invention.

FIG. 17 shows a plan view of this embodiment of the semiconductor device. In this figure, the interconnect pattern 220 is formed from the electrodes 212 of the semiconductor chip 210 toward the center of the active surface, and the interconnect pattern 220 is provided with the external terminals 230.

It should be noted that the external terminals 230 are provided in the active region of the semiconductor chip 210, the first and second insulating layers 240 and 242 (see FIG. 16) are provided in the active region, and the interconnect pattern 220 is disposed within the active region, with respect to which the description of the first embodiment in relation to FIG. 2 applies. Also in regard to the form of the interconnect pattern 220, the description of the first embodiment in relation to FIG. 2 applies.

Next, the method of manufacture of this embodiment of the semiconductor device is described.

First, as described in the first embodiment, a semiconductor wafer is taken, before separation into semiconductor chips 210. The semiconductor wafer has a plurality of electrodes 212 and a passivation film which is formed avoiding the electrodes 212. The interconnect pattern 220 is formed from the electrodes 212. Over this, the first and second insulating layers 240 and 242 are formed, and the first and second opening portions 244 and 246 are formed over the interconnect pattern 220 at the positions of bonding with the external terminals 230. Then the external terminals 230 are provided on the interconnect pattern 220 through the first and second opening portions 244 and 246. A part of the external terminals 230 (for example base 232) is provided to contact the inner surface of the first and second opening portions 244 and 246. For example, the base 232 is formed not only over the interconnect pattern 220, but also integrally on the inner surface of the first and second opening portions 244 and 246 by sputtering or the like. When the base 232 is provided, the connection portion 234 such as solder balls is provided thereon. Alternatively, a solder cream may be provided on the base 232, this may be fused, and formed into a ball by surface tension. If required, a protective layer may be further formed on the second insulating layer 242.

Then the semiconductor wafer is diced, and the above described semiconductor device 201 can be obtained.

Eighth Embodiment

Figure 18:
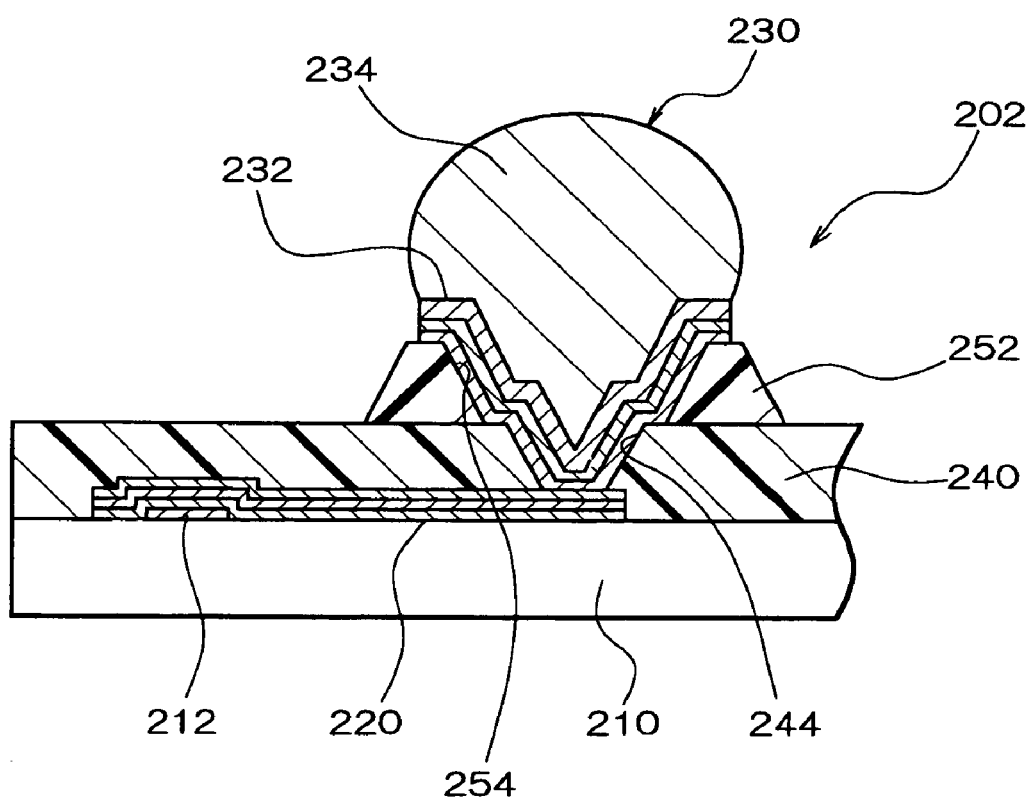
FIG. 18 shows an eighth embodiment of the semiconductor device of the present invention.

FIG. 18 shows an eighth embodiment of the semiconductor device. A semiconductor device 202 differs from that of the seventh embodiment in that a second insulating layer 252 is formed on the surface of the first insulating layer 240 only around the external terminals 230. In other respects this is the same as the seventh embodiment. It should be noted that in the second insulating layer 252, second opening portions 254 of the same construction as the second opening portions 246 of the seventh embodiment are formed. According to this embodiment, since the second insulating layer 252 is small in plan view, it is easily deformed, and is more able to cope with stress stemming from thermal stress.

Ninth Embodiment

Figure 19:
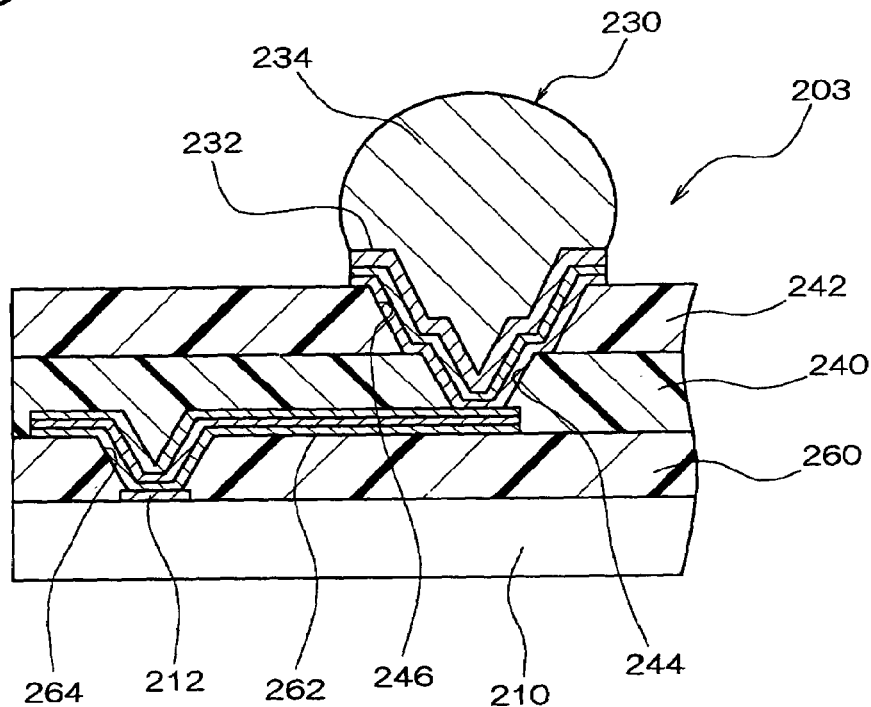
FIG. 19 shows a ninth embodiment of the semiconductor device of the present invention.

FIG. 19 shows a ninth embodiment of the semiconductor device. A semiconductor device 203 differs from that of the seventh embodiment in that a third insulating layer 260 is formed on the semiconductor chip 210, and an interconnect pattern 262 is formed thereon.

The third insulating layer 260 can be formed of the materials which can be selected for the first and second insulating layers 240 and 242. The third insulating layer 260 is formed on the surface of the semiconductor chip 210 on which the electrodes 212 are formed, avoiding the electrodes 212. Third opening portions 264 are formed in the third insulating layer 260, over the electrodes 212. The interconnect pattern 262 is also formed on the inner surface of each third opening portion. The inner surface of the third opening portion 264 is an inclined surface, providing a taper such that the opening increases in size progressively from the bottom. As a result, the interconnect pattern 262 rises not perpendicularly but gently from the electrode 212 to the top surface of the third insulating layer 260. In this way, since the bending angle of the interconnect pattern 262 is gentle, breakage thereof is prevented.

Then on the interconnect pattern 262, in addition to the provision of the external terminals 230, first and second insulating layers 240 and 242 are formed. For the details thereof, the description of the seventh embodiment is applied.

According to this embodiment, in addition to the effect described in the seventh embodiment, stress can also be relieved by the third insulating layer 260.

Tenth Embodiment

Figure 20:
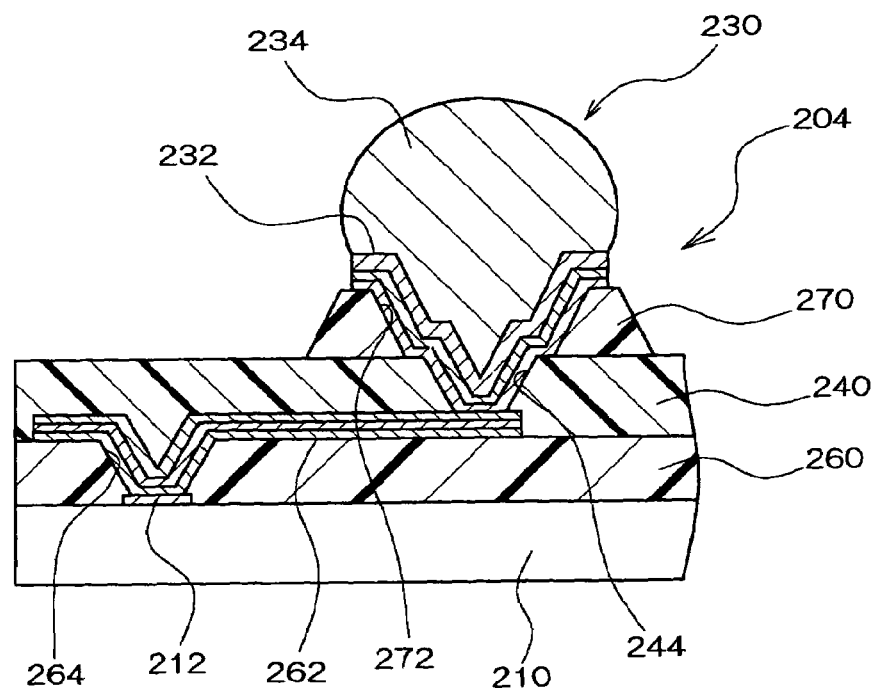
FIG. 20 shows a tenth embodiment of the semiconductor device of the present invention.

FIG. 20 shows a tenth embodiment of the semiconductor device. A semiconductor device 204 differs from that of the ninth embodiment in that a second insulating layer 270 is formed on the surface of the first insulating layer 240 only around the external terminals 230. In other respects this is the same as the ninth embodiment. It should be noted that in the second insulating layer 270, second opening portions 272 of the same construction as the second opening portions 246 of the ninth embodiment are formed. According to this embodiment, since the second insulating layer 270 is small in plan view, it is easily deformed, and is more able to cope with stress stemming from thermal stress.

Figure 21:
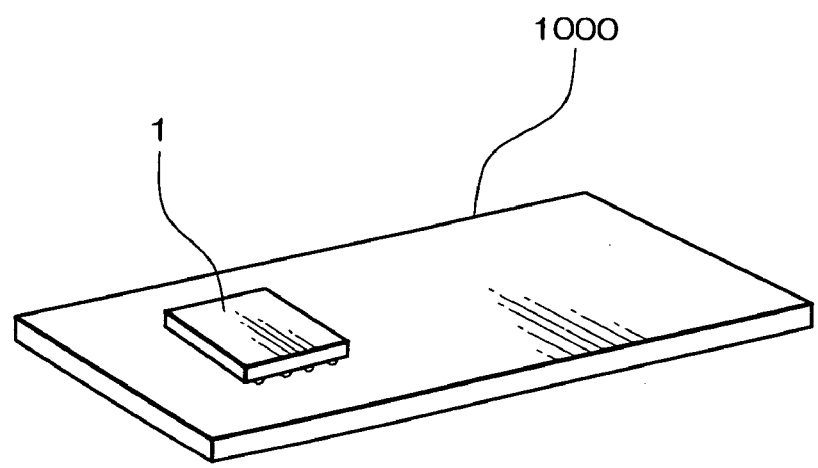
FIG. 21 shows a circuit board on which is mounted the semiconductor device of the present embodiment.

FIG. 21 shows a circuit board 1000 on which is mounted this embodiment of the semiconductor device 1. An organic substrate such as a glass epoxy substrate or the like is generally used for the circuit board 1000. On the circuit board 1000, an interconnect pattern of for example copper is formed to constitute a desired circuit, then by mechanical connection of this interconnect pattern and the external terminals 30 of the semiconductor device 1, electrical connection is achieved.

Figure 22:
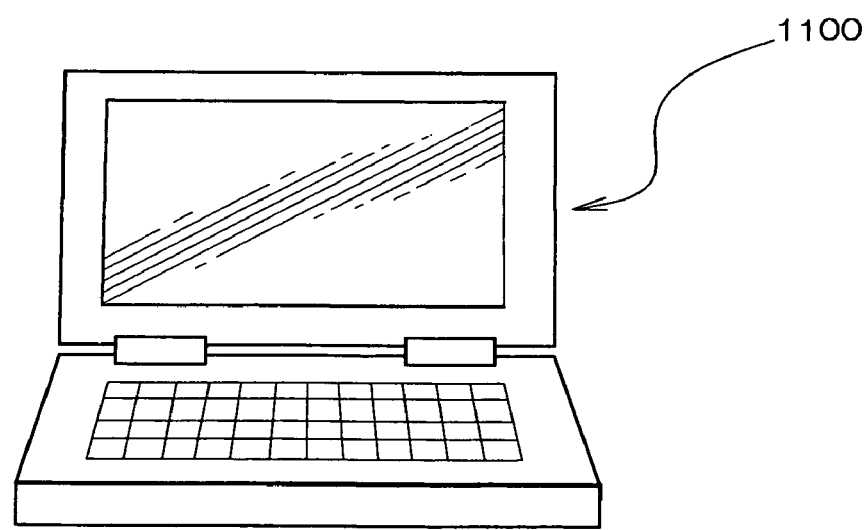
FIG. 22 shows an electronic instrument which includes the semiconductor device of the present embodiment.

Then as an electronic instrument 1100 equipped with the semiconductor device 1 to which the present invention is applied, a notebook personal computer 1100 is shown in FIG. 22.

It should be noted that the above-described "semiconductor chip" that is a structural component of the present invention could be replaced by an "electronic element," and an electronic element (whether an active element or a passive element) can be mounted on a substrate to fabricate an electronic component, in the same way as a semiconductor chip. As electronic components manufactured by using such an electronic element may be cited, for example, resistors, capacitors, coils, oscillators, filters, temperature sensors, thermistors, varistors, variable resistors, and fuses.

What is claimed is:

1. A semiconductor device comprising:
a semiconductor element having a plurality of electrodes,
an interconnect pattern electrically connected to the electrodes,
external terminals electrically connected to the interconnect pattern, each of the external terminals not overlapping with any one of the electrodes, and
a plurality of insulating layers formed around the external terminals, the insulating layers including a first layer, the insulating layers including a second layer formed closer to the semiconductor element than the first layer,
wherein the interconnect pattern is formed between the semiconductor element and the plurality of insulating layers,
wherein the second layer contacts the interconnect pattern, and the first layer does not contact the interconnect pattern,
wherein the coefficient of thermal expansion of the first layer is greater than the coefficient of thermal expansion of the second layer.

2. The semiconductor device as defined in claim 1, wherein at least one of the plurality of insulating layers has a stress relieving function.

3. The semiconductor device as defined in claim 1, wherein at least one of the plurality of insulating layers is formed of a resin.

4. The semiconductor device as defined in claim 1, wherein the insulating layers contact the external terminals at opening portions each of which has an inclined surface providing a taper increasing in size from the second layer to the first layer.

5. The semiconductor device as defined in claim 1, wherein each of the external terminals includes a base and a connection portion provided on the base; and
wherein the base is provided in an opening portion through which each of the external terminals contact the insulating layers.

6. The semiconductor device as defined in claim 1, wherein the insulating layers contact the external terminals at opening portions each of which is formed with a curved surface.

7. The semiconductor device as defined in claim 1, wherein the interconnect pattern is formed on a stress relieving layer formed below the plurality of insulating layers.

8. The semiconductor device as defined in claim 1, wherein the uppermost layer of the insulating layers is formed over the whole surface of a layer just under the uppermost layer, the uppermost layer formed in a region except for an area of the external terminals.

9. The semiconductor device as defined in claim 1, wherein the uppermost layer of the insulating layers has its area smaller than an area of a layer just under the uppermost layer.

10. A semiconductor device comprising:
a semiconductor element having a plurality of electrodes;
an interconnect pattern electrically connected to the electrodes;
external terminals electrically connected to the interconnect pattern, each of the external terminals not overlapping with any one of the electrodes; and
a plurality of insulating layers formed around the external terminals, the insulating layers including a first layer, the insulating layers including a second layer formed closer to the semiconductor element than the first layer;
wherein the interconnect pattern is formed between the semiconductor element and the plurality of insulating layers;
wherein the second layer contacts the interconnect pattern and the first layer does not contact the interconnect pattern;
wherein the Young's modulus of the second layer is greater than the Young's modulus of the first layer.

11. The semiconductor device as defined in claim 10, wherein at least one of the plurality of insulating layers has a stress relieving function.

12. The semiconductor device as defined in claim 10, wherein at least one of the plurality of insulating layers is formed of a resin.

13. The semiconductor device as defined in claim 10, wherein the insulating layers contact the external terminals at opening portions each of which has an inclined surface providing a taper increasing in size from the second layer to the first layer.

14. The semiconductor device as defined in claim 10, wherein each of the external terminals includes a base and a connection portion provided on the base; and
wherein the base is provided in an opening portion through which each of the external terminals contact the insulating layers.

15. The semiconductor device as defined in claim 10, wherein the insulating layers contact the external terminals at opening portions each of which is formed with a curved surface.

16. The semiconductor device as defined in claim 10, wherein the interconnect pattern is formed on a stress relieving layer formed below the plurality of insulating layers.

17. The semiconductor device as defined in claim 10, wherein the uppermost layer of the insulating layers is formed over the whole surface of a layer just under the uppermost layer, the uppermost layer formed in a region except for an area of the external terminals.

18. The semiconductor device as defined in claim 10, wherein the uppermost layer of the insulating layers has its area smaller than an area of a layer just under the uppermost layer.

* * * * *